United States Patent
Yamashita

(10) Patent No.: US 9,445,024 B2
(45) Date of Patent: *Sep. 13, 2016

(54) SOLID-STATE IMAGE SENSOR AND CAMERA SYSTEM

(71) Applicant: Sony Corporation, Tokyo (JP)

(72) Inventor: Kazuyoshi Yamashita, Kanagawa (JP)

(73) Assignee: SONY CORPORATION, Tokyo (JP)

(*) Notice: Subject to any disclaimer, the term of this patent is extended or adjusted under 35 U.S.C. 154(b) by 84 days.

This patent is subject to a terminal disclaimer.

(21) Appl. No.: 14/579,378

(22) Filed: Dec. 22, 2014

(65) Prior Publication Data

US 2015/0109499 A1 Apr. 23, 2015

Related U.S. Application Data

(63) Continuation of application No. 13/747,183, filed on Jan. 22, 2013, now Pat. No. 8,964,084.

(30) Foreign Application Priority Data

Jan. 31, 2012 (JP) ................... 2012-018383

(51) Int. Cl.

| | |
|---|---|
| *H04N 5/335* | (2011.01) |
| *H04N 5/374* | (2011.01) |
| *H04N 5/378* | (2011.01) |
| *H04N 5/369* | (2011.01) |
| *H04N 5/3745* | (2011.01) |

(Continued)

(52) U.S. Cl.
CPC ...... *H04N 5/3696* (2013.01); *H01L 27/14607* (2013.01); *H01L 27/14609* (2013.01); *H01L 27/14641* (2013.01); *H04N 5/23212* (2013.01); *H04N 5/374* (2013.01); *H04N 5/37457* (2013.01); *H04N 9/045* (2013.01)

(58) Field of Classification Search
CPC ............... H04N 5/3696; H04N 9/045; H04N 5/23212; H04N 5/37457; H04N 5/374; H01L 27/14641; H01L 27/14607; H01L 27/14609

See application file for complete search history.

(56) References Cited

U.S. PATENT DOCUMENTS

| | | |
|---|---|---|
| 6,781,632 B1 | 8/2004 | Ide |
| 6,947,088 B2 | 9/2005 | Kochi |

(Continued)

FOREIGN PATENT DOCUMENTS

| | | |
|---|---|---|
| JP | 2007-103590 | 4/2007 |
| JP | 2007-127746 | 5/2007 |
| JP | 2008-103885 | 5/2008 |

*Primary Examiner* — Roberto Velez
*Assistant Examiner* — Tuan Le
(74) *Attorney, Agent, or Firm* — Dentons US LLP

(57) ABSTRACT

Provided is a solid-state image sensor including a pixel array portion formed from a two-dimensional array of ordinary imaging pixels each having a photoelectric conversion unit and configured to output an electric signal obtained through photoelectric conversion as a pixel signal, and focus detection pixels for detecting focus. The focus detection pixels include at least a first focus detection pixel and a second focus detection pixel each having a photoelectric conversion unit and configured to transfer and output an electric signal obtained through photoelectric conversion to an output node. The first focus detection pixel and the second focus detection pixel share the output node. The first focus detection pixel includes a first photoelectric conversion unit, and a first transfer gate for reading out an electron generated through photoelectric conversion in the first photoelectric conversion unit to the shared output node.

16 Claims, 21 Drawing Sheets

(51) Int. Cl.
*H01L 27/146* (2006.01)
*H04N 5/232* (2006.01)
*H04N 9/04* (2006.01)

(56) References Cited

U.S. PATENT DOCUMENTS

| | | | |
|---|---|---|---|
| 7,411,170 B2 | 8/2008 | Shimotsusa et al. | |
| 7,432,540 B2 | 10/2008 | McKee | |
| 7,880,871 B2 | 2/2011 | Kazama et al. | |
| 8,638,381 B2 * | 1/2014 | Murata | G02B 3/0056 348/272 |
| 8,749,695 B2 * | 6/2014 | Kita | H04N 5/23212 348/294 |
| 2004/0252215 A1 | 12/2004 | Mori | |
| 2006/0001751 A1 | 1/2006 | Abe et al. | |
| 2006/0027843 A1 | 2/2006 | Ogura et al. | |
| 2007/0164332 A1 | 7/2007 | Paik et al. | |
| 2007/0285526 A1 | 12/2007 | Mann et al. | |
| 2008/0074534 A1 | 3/2008 | Kusaka | |
| 2008/0296645 A1 | 12/2008 | Itonaga | |
| 2009/0046186 A1 | 2/2009 | Nagai | |
| 2010/0328510 A1 | 12/2010 | Hiyama et al. | |
| 2011/0025904 A1 * | 2/2011 | Onuki | G02B 7/34 348/360 |
| 2011/0096212 A1 * | 4/2011 | Oikawa | G03B 13/36 348/273 |
| 2012/0038810 A1 * | 2/2012 | Taniguchi | H01L 27/14621 348/308 |
| 2013/0161486 A1 * | 6/2013 | Adachi | H01L 27/14643 250/208.1 |
| 2013/0182156 A1 * | 7/2013 | Moriya | H04N 5/335 348/294 |
| 2013/0229556 A1 * | 9/2013 | Suzuki | H01L 27/14609 348/300 |

\* cited by examiner

EXAMPLE IN WHICH LEFT AND RIGHT LIGHT-SHIELDED AF PIXELS ARE ARRANGED

EXAMPLE IN WHICH UPPER AND BOTTOM LIGHT-SHIELDED AF PIXELS ARE ARRANGED

EXAMPLE IN WHICH LEFT AND RIGHT LIGHT-SHIELDED AF PIXELS AND
UPPER AND BOTTOM LIGHT-SHIELDED AF PIXELS ARE MIXED

FIG. 15
(A)
EXAMPLE OF AF PIXELS
IN WHICH LEFT UPPER CORNER
IS SHIELDED AGAINST LIGHT
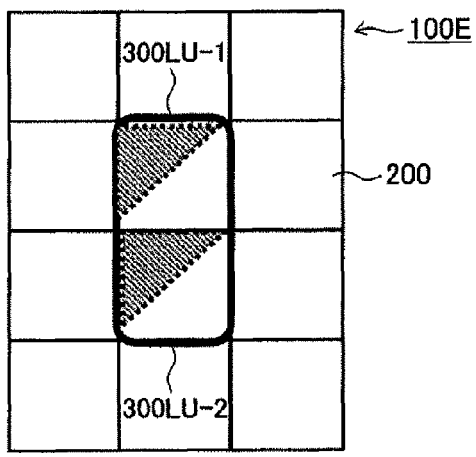
(B)
EXAMPLE OF AF PIXELS
IN WHICH RIGHT UPPER CORNER
IS SHIELDED AGAINST LIGHT
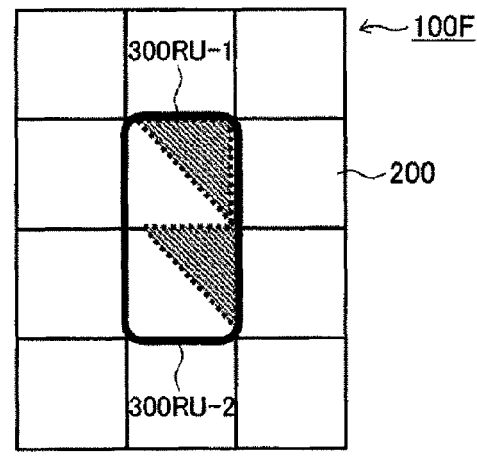
(C)
EXAMPLE OF AF PIXELS
IN WHICH LEFT BOTTOM CORNER
IS SHIELDED AGAINST LIGHT
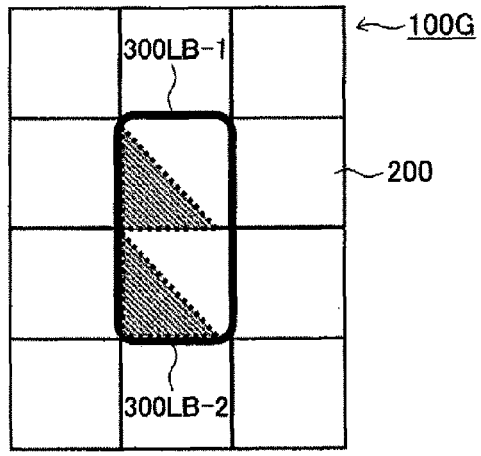
(D)
EXAMPLE OF AF PIXELS
IN WHICH RIGHT BOTTOM CORNER
IS SHIELDED AGAINST LIGHT
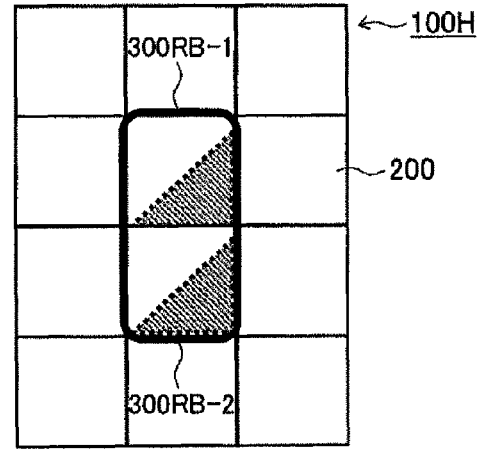

EXAMPLE IN WHICH TRANSFER GATE (TRANSFER WIRE) OF LEFT AND RIGHT LIGHT-SHIELDED AF PIXELS ARE SHARED AND ARRANGED IN UNITS OF FOUR PIXELS

EXAMPLE IN WHICH TRANSFER GATE (TRANSFER WIRE) OF LEFT AND RIGHT LIGHT-SHIELDED AF PIXELS ARE SHARED AND ARRANGED IN UNITS OF FOUR PIXELS

EXAMPLE WHEN THERE IS NO CF
(MONOCHROME PRODUCT)

EXAMPLE OF BAYER ARRAY WHEN
THERE IS NO CF FOR AF PIXELS

EXAMPLE OF BAYER ARRAY WHEN THERE IS CF FOR AF PIXELS

ALTHOUGH SHOWN FOR G, MAY ALSO BE SHOWN FOR R OR B

EXAMPLE IN WHICH ONLY ONE ELEMENT INCLUDES CF

ALTHOUGH SHOWN FOR G, MAY ALSO BE SHOWN FOR R OR B

SOLID-STATE IMAGE SENSOR AND CAMERA SYSTEM

RELATED APPLICATION DATA

This application is a continuation of U.S. patent application Ser. No. 13/747,183 filed Jan. 22, 2013, the entirety of which is incorporated herein by reference to the extent permitted by law. The present application claims the benefit of priority to Japanese Patent Application No. JP2012-018383 filed on Jan. 31, 2012 in the Japan Patent Office, the entirety of which is incorporated by reference herein to the extent permitted by law.

BACKGROUND

The present technology relates to a solid-state image sensor, represented by a CMOS (complementary metal oxide semiconductor), on which ordinary imaging pixels and focus detection pixels are two-dimensionally arrayed, and a camera system.

An example of a known focus detection technology is pupil division phase difference.

In a pupil division phase difference method, the amount of defocus of an imaging lens is detected by dividing the light beams passing through the imaging lens to form a pair of divided images, and detecting pattern deviation between this pair of divided images.

A solid-state image sensor applying such a pupil division phase difference method is described in, for example, JP 2008-103885A and JP 2007-103590A.

The solid-state image sensor described in JP 2008-103885A is formed from a two-dimensional array of imaging pixels having a photoelectric conversion unit and focus detection pixels that have pairs of a first photoelectric conversion unit and a second photoelectric conversion unit.

Further, at an output unit, as illustrated in FIG. 1, a signal obtained by adding the respective outputs from the first photoelectric conversion units 11 and 21 of a first focus detection pixel 1 and a second focus detection pixel 2 that are adjacent to each other is output from the first focus detection pixel 1. Similarly, a signal obtained by adding the outputs from the second photoelectric conversion units 21 and 22 is output from the second focus detection pixel 2.

Namely, the solid-state image sensor described in JP 2008-103885A has two photoelectric conversion units for one focus detection pixel (AF pixel). Further, the charge signals from the photoelectric conversion units forming a focus detection pair are added at a floating diffusion layer, which is an output node.

The solid-state image sensor described in JP 2007-103590A is formed from a two-dimensional array of first pixel cells 3 as illustrated in FIG. 2(A) and second pixel cells 4 as illustrated in FIG. 2(B).

The first pixel cells 3 include a first photoelectric conversion unit 31 that generates charges based on incident light.

The second pixel cells 4 include an optical element (microlens) that collects incident light and second photoelectric conversion units 42 and 43 that generate charges based on the light collected by the optical element.

A solid-state image sensor configured so that the focus detection pixels are larger than the ordinary imaging pixels is also described in JP 2007-127746.

SUMMARY

However, the above-described technologies suffer from the following drawbacks.

In the solid-state image sensor described in JP 2008-103885A, with a layout like that illustrated in FIG. 16 of JP 2008-103885A, the FD portion becomes larger. Consequently, conversion efficiency deteriorates, and sensitivity during low illumination decreases, so that low illumination S/N is low. When there is a lot of so-called 1/f noise, for example, the detection accuracy at a low illumination decreases.

For such a solid-state image sensor, since an area that separates the photoelectric conversion area (PD) is necessary in each focus detection pixel, Qs is half or less that of an ordinary pixel.

Since it is necessary to prevent color mixing in the pulses by separating the photoelectric conversion area (PD), a high-level fine process is necessary. Consequently, this technology is not suited to pixel miniaturization.

Further, a potential design that is different for the ordinary pixels and the focus detection pixels becomes necessary, so that the number of steps increases, which can even cause costs to increase.

In the solid-state image sensor described in JP 2007-103590A, for an example of FD addition like that illustrated in FIG. 16 of JP 2007-103590A, two transfer gates (85 and 86) have to be simultaneously on, and during focus detection, the drive method of the surrounding circuits has to be separated from that of the ordinary drive.

Therefore, this technology is not suited to high-speed imaging.

Further, in this solid-state image sensor, since two pixels are simultaneously read even for the ordinary pixels, the color of the ordinary pixels are difficult to be differentiated.

Consequently, this technology suffers from the drawbacks of a deterioration in image quality and resolution.

Since the solid-state image sensor described in JP 2007-127746 has portions that are far away from a transfer gate, this technology is susceptible to residual images.

Further, differences in the characteristics of the ordinary pixels and the focus detection pixels tend to occur, and image deterioration due to the fixed pattern noise of only the focus detection pixels can occur.

To avoid residual image defects, the voltage of the focus detection pixel transfer gates has to be increased. However, this leads to increased power consumption.

To avoid transfer defects, an implementation step to aid transfer has to be added. However, this causes costs to increase.

If an implementation step is added to the focus detection pixels, process unevenness factors, such as alignment deviation, increase, so that the characteristics tend to become uneven. This can lead to deterioration in image quality and yield.

According to an embodiment of the present technology, there is provided a solid-state image sensor, and a camera system, capable of improving focus detection accuracy during low illumination while suppressing deterioration in image quality, deterioration in yield, increases in power consumption, and increases in costs.

According to a first embodiment of the present disclosure, there is provided a solid-state image sensor including a pixel array portion formed from a two-dimensional array of ordinary imaging pixels each having a photoelectric conversion unit and configured to output an electric signal obtained through photoelectric conversion as a pixel signal, and focus detection pixels for detecting focus. The focus detection pixels include at least a first focus detection pixel and a second focus detection pixel each having a photoelectric conversion unit and configured to transfer and output an electric signal obtained through photoelectric conversion to an output node. The first focus detection pixel and the second focus detection pixel share the output node. The first focus detection pixel includes a first photoelectric conversion unit, and a first transfer gate for reading out an electron generated through photoelectric conversion in the first photoelectric conversion unit to the shared output node. The second focus detection pixel includes a second photoelectric conversion unit, and a second transfer gate for reading out an electron generated through photoelectric conversion in the second photoelectric conversion unit to the shared output node. The first transfer gate of the first focus detection pixel and the second transfer gate of the second focus detection pixel are electrically shared by a gate electrode to which a control signal for conduction control is applied.

According to a second embodiment of the present disclosure, there is provided a camera system including a solid-state image sensor, an optical unit configured to form an image of an object image on the solid-state image sensor, and a signal processing unit configured to process an output signal from the solid-state image sensor, the solid-state image sensor including a pixel array portion formed from a two-dimensional array of ordinary imaging pixels each having a photoelectric conversion unit and configured to output an electric signal obtained through photoelectric conversion as a pixel signal, and focus detection pixels for detecting focus. The focus detection pixels include at least a first focus detection pixel and a second focus detection pixel each having a photoelectric conversion unit and configured to transfer and output an electric signal obtained through photoelectric conversion to an output node. The first focus detection pixel and the second focus detection pixel share the output node. The first focus detection pixel includes a first photoelectric conversion unit, and a first transfer gate for reading out an electron generated through photoelectric conversion in the first photoelectric conversion unit to the shared output node. The second focus detection pixel includes a second photoelectric conversion unit, and a second transfer gate for reading out an electron generated through photoelectric conversion in the second photoelectric conversion unit to the shared output node. The first transfer gate of the first focus detection pixel and the second transfer gate of the second focus detection pixel are electrically shared by a gate electrode to which a control signal for conduction control is applied.

According to an embodiment of the present technology, focus detection accuracy during low illumination can be improved while suppressing deterioration in image quality, deterioration in yield, increases in power consumption, and increases in costs.

BRIEF DESCRIPTION OF THE DRAWINGS

FIG. 15 is a series of diagrams illustrating, for a 2-pixel-sharing case, a fourth example of a light shielding pattern of the focus detection pixels arranged in a pixel array portion as a fourth embodiment of the present technology;

DETAILED DESCRIPTION OF THE EMBODIMENT(S)

Figure 1:
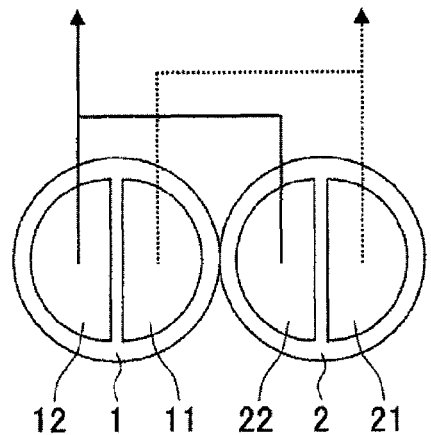
FIG. 1 is a diagram illustrating the focus detection pixels disclosed in JP 2008-103885A.
Figure 2:
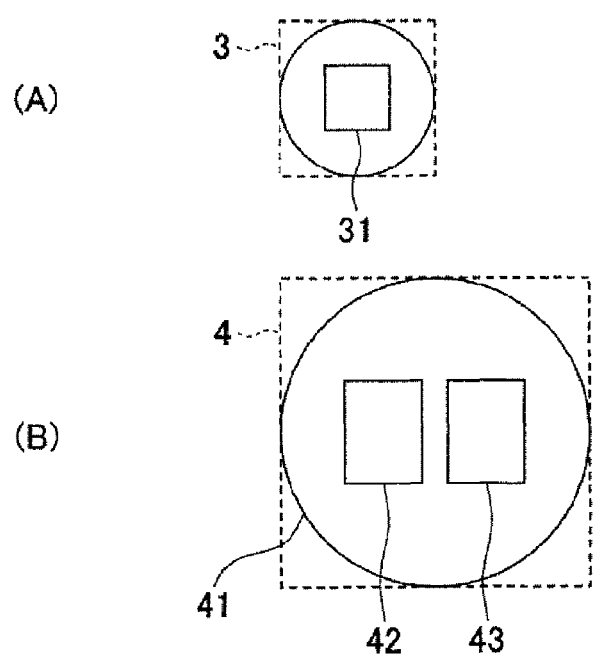
FIG. 2 is a diagram illustrating the imaging pixels and the focus detection pixels disclosed in JP 2007-103590A.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Embodiments of the present technology will now be described with reference to the drawings. The description will be made in the following order: 1. Overall schematic configuration of a solid-state image sensor; 2. First embodiment (configuration example of vertical 2-pixel sharing; 3. Second embodiment (configuration example of a 2-pixel-sharing transfer wire; 4. Third embodiment (example of a 4-pixel-sharing pixel array; 5. Fourth embodiment (example of focus detection pixel light shielding patterns); 6. Fifth embodiment (configuration example of focus detection pixels associated with a color filter); 7. Sixth embodiment (configuration example of horizontal 2-pixel sharing; and 8. Configuration example of a camera system.

1. Overall Schematic Configuration of a Solid-State Image Sensor

Figure 3:
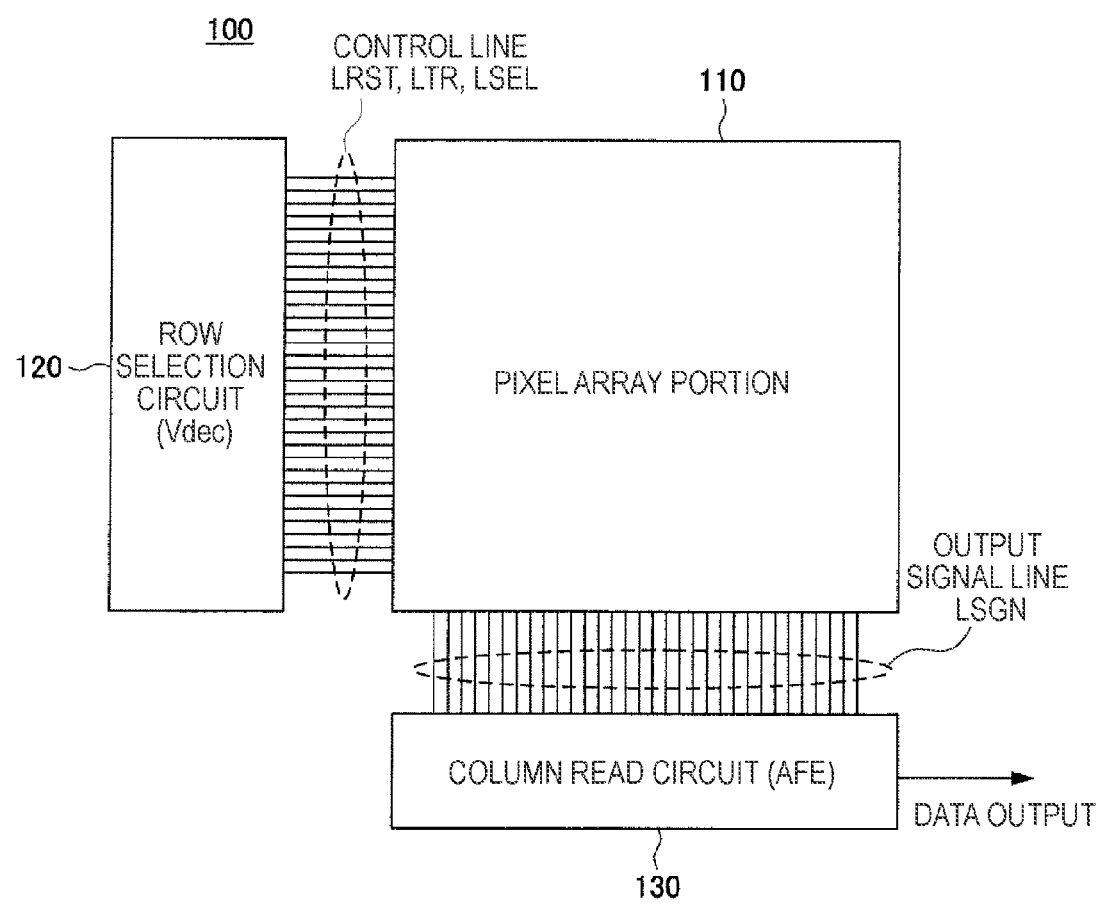
FIG. 3 is a diagram illustrating a configuration example of a solid-state image sensor according to an embodiment of the present technology.

FIG. 3 is a diagram illustrating a configuration example of a solid-state image sensor according to an embodiment of the present technology.

Figure 4:
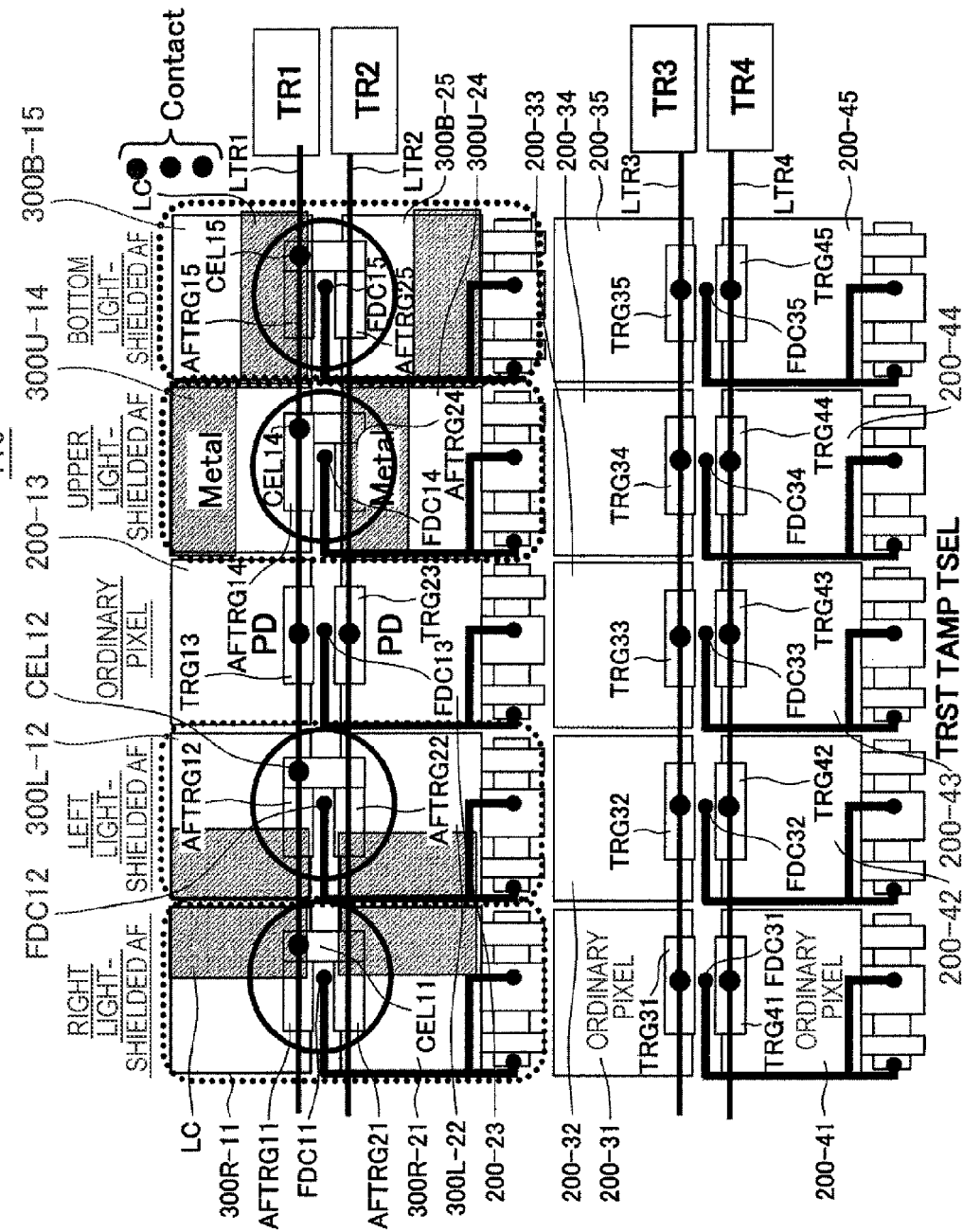
FIG. 4 is a diagram illustrating a configuration example of a pixel array portion of a solid-state image sensor according to an embodiment of the present technology.

FIG. 4 is a diagram illustrating a configuration example of a pixel array portion in a solid-state image sensor according to an embodiment of the present technology.

In the following embodiment of the present technology, a CMOS sensor will be described as an example of a solid-state image sensor.

A solid-state image sensor 100 includes a pixel array portion 110, a row selection circuit (Vdec) 120, and a column read circuit (AFE) 130.

A pixel signal read unit is formed by the row selection circuit 120 and the column read circuit 130.

The pixel array portion 110 is formed from a plurality of pixel circuits arrayed in two-dimensions (in a matrix) of M rows×N columns.

Specifically, as illustrated in FIG. 4, the pixel array portion 110 is formed from a two-dimensional array of a mixture of ordinary imaging pixels 200 having a photoelectric conversion unit and focus detection pixels (AF pixels) 300 having a photoelectric conversion unit.

The pixel array portion 110 according to an embodiment of the present technology has a configuration in which a floating diffusion (FD) layer is shared as an output node between two adjacent imaging pixels 200. FIG. 4 illustrates a configuration example in which two imaging pixels 200 adjacent in a perpendicular direction share an FD layer as an output node.

Similarly, the pixel array portion 110 according to an embodiment of the present technology has a configuration in which two adjacent focus detection pixels 300 share an FD layer as an output node. Similar to the imaging pixels, FIG. 4 illustrates a configuration example in which two focus detection pixels 300 adjacent in a perpendicular direction share an FD layer as an output node.

A first focus detection pixel 300-1 and a second focus detection pixel 300-2 that share an FD layer have a first transfer gate AFTRG1 and a second transfer gate AFTRG2, respectively, for reading the electrons (charges) produced by photoelectric conversion in a photoelectric conversion unit PD.

The first transfer gate AFTRG1 and second transfer gate AFTRG2 are electrically connected (shared).

In other words, the first transfer gate AFTRG1 and second transfer gate AFTRG2 are controlled to be simultaneously turned on and off in parallel by the same transfer control signal TR.

Further, each of the focus detection pixels 300 are configured so that, for example, roughly half of the area where light is incident on the photoelectric conversion unit is shielded by a light shielding portion LC.

The first focus detection pixel 300-1 and the second focus detection pixel 300-2 sharing an FD layer have the same aperture size.

Further, the ordinary imaging pixels 200 are configured so that even though a part of the area where light is incident on the photoelectric conversion unit is shielded, the light incident area is larger than that of the focus detection pixels 300. In other words, the imaging pixels 200 have a larger aperture size than the aperture size of the focus detection pixels.

However, according to an embodiment of the present technology, the ordinary imaging pixels 200 and the focus detection pixels 300 may have the same pixel size.

Various modes of the light shielded site are possible for the focus detection pixels 300.

The example illustrated in FIG. 4 illustrates, as viewed from the front, a right light-shielded focus detection pixel 300-R, in which a portion on the right side (a first edge portion) of a focus detection pixel 300 forming a rectangular shape is shielded, and a left light-shielded focus detection pixel 300-L, in which a portion on the left side (a second edge portion) is shielded.

In addition, the example illustrated in FIG. 4 also shows an upper light-shielded focus detection pixel 300-U, in which a portion on the upper side (a third edge portion) of a focus detection pixel 300 is shielded, and a bottom light-shielded focus detection pixel 300-B, in which a portion on the lower side (a fourth edge portion) is shielded.

In FIG. 4, to simplify the diagram, a 4×4 pixel array is illustrated. In the pixel array illustrated in FIG. 4, the imaging pixels 200 and focus detection pixels 300 are arranged as follows.

[Pixel Array Example]

In the first row, a right light-shielded focus detection pixel 300R-11 is arranged in the first column, a left light-shielded focus detection pixel 300L-12 is arranged in the second column, an ordinary imaging pixel 200-13 is arranged in the third column, an upper light-shielded focus detection pixel 300U-14 is arranged in the fourth column, and a bottom light-shielded focus detection pixel 300L-15 is arranged in the fifth column.

In the second row, a right light-shielded focus detection pixel 300R-21 is arranged in the first column, a left light-shielded focus detection pixel 300L-22 is arranged in the second column, an ordinary imaging pixel 200-23 is arranged in the third column, an upper light-shielded focus detection pixel 300U-24 is arranged in the fourth column, and a bottom light-shielded focus detection pixel 300L-25 is arranged in the fifth column.

In the third row, an ordinary imaging pixel 200-31 is arranged in the first column, an imaging pixel 200-32 is arranged in the second column, an imaging pixel 200-33 is arranged in the third column, an imaging pixel 200-34 is arranged in the fourth column, and an imaging pixel 200-35 is arranged in the fifth column.

In the fourth row, an ordinary imaging pixel 200-41 is arranged in the first column, an imaging pixel 200-42 is arranged in the second column, an imaging pixel 200-43 is arranged in the third column, an imaging pixel 200-44 is arranged in the fourth column, and an imaging pixel 200-45 is arranged in the fifth column.

In the example illustrated in FIG. 4, the right light-shielded first focus detection pixel 300R-11 of the first row, first column and the right light-shielded second focus detection pixel 300R-21 of the second row, first column share a floating diffusion layer FDC11 as an output node. Further, the first focus detection pixel 300R-11 and the second focus detection pixel 300R-21 also share a reset transistor TRST, an amplification transistor TAMP, and a selection transistor TSEL.

The first focus detection pixel 300R-11 has a first transfer gate AFTRG11, and the second focus detection pixel 300R-21 has a second transfer gate AFTRG21.

The first transfer gate AFTRG11 and the second transfer gate AFTRG21 are electrically connected by a connection electrode CEL11.

Further, the connection electrode CEL11 connecting the first transfer gate AFTRG11 and the second transfer gate AFTRG21 is connected to a transfer control line LTR1 along which a transfer control signal TR1 is carried.

Consequently, the first transfer gate AFTRG11 and the second transfer gate AFTRG21 are controlled to be simultaneously turned on and off in parallel by the same transfer control signal TR1.

The left light-shielded first focus detection pixel 300L-12 of the first row, second column and the left light-shielded second focus detection pixel 300L-22 of the second row, second column share a floating diffusion layer FDC 12 as an output node. Further, the first focus detection pixel 300L-12 and the second focus detection pixel 300L-22 also share a reset transistor TRST, an amplification transistor TAMP, and a selection transistor TSEL.

The first focus detection pixel 300L-12 has a first transfer gate AFTRG12, and the second focus detection pixel 300L-22 has a second transfer gate AFTRG22.

The first transfer gate AFTRG12 and the second transfer gate AFTRG22 are electrically connected by a connection electrode CEL12.

Further, the connection electrode CEL12 connecting the first transfer gate AFTRG12 and the second transfer gate AFTRG22 is connected to the transfer control line LTR1 along which the transfer control signal TR1 is carried.

Consequently, the first transfer gate AFTRG12 and the second transfer gate AFTRG22 are controlled to be simultaneously turned on and off in parallel by the same transfer control signal TR1.

The first imaging pixel 200-13 of the first row, third column and the second imaging pixel 200-23 of the second row, third column share a floating diffusion layer FDC13 as an output node. Further, the first imaging pixel 200-13 and the second imaging pixel 200-23 also share a reset transistor TRST, an amplification transistor TAMP, and a selection transistor TSEL.

The first imaging pixel 200-13 has a first transfer gate TRG13, and the second imaging pixel 200-23 has a second transfer gate TRG23.

The first transfer gate TRG13 is connected to the transfer control line LTR1 along which the transfer control signal TR1 is carried.

The second transfer gate TRG23 is connected to a transfer control line LTR2 along which a transfer control signal TR2 is carried.

Consequently, the first transfer gate TRG13 and the second transfer gate TRG23 are controlled to be individually turned on and off by different transfer control signals TR1 and TR2.

The upper light-shielded first focus detection pixel 300U-14 of the first row, fourth column and the upper light-shielded second focus detection pixel 300U-24 of the second row, fourth column share a floating diffusion layer FDC14 as an output node. Further, the first focus detection pixel 300U-14 and the second focus detection pixel 300U-24 also share a reset transistor TRST, an amplification transistor TAMP, and a selection transistor TSEL.

The first focus detection pixel 300U-14 has a first transfer gate AFTRG14, and the second focus detection pixel 300U-24 has a second transfer gate AFTRG24.

The first transfer gate AFTRG14 and the second transfer gate AFTRG24 are electrically connected by a connection electrode CEL14.

Further, the connection electrode CEL14 connecting the first transfer gate AFTRG14 and the second transfer gate AFTRG24 is connected to the transfer control line LTR1 along which the transfer control signal TR1 is carried.

Consequently, the first transfer gate AFTRG14 and the second transfer gate AFTRG24 are controlled to be simultaneously turned on and off in parallel by the same transfer control signal TR1.

The bottom light-shielded first focus detection pixel 300B-15 of the first row, fifth column and the bottom light-shielded second focus detection pixel 300B-25 of the second row, fifth column share a floating diffusion layer FDC15 as an output node. Further, the first focus detection pixel 300B-15 and the second focus detection pixel 300B-25 also share a reset transistor TRST, an amplification transistor TAMP, and a selection transistor TSEL.

The first focus detection pixel 300B-15 has a first transfer gate AFTRG15, and the second focus detection pixel 300B-25 has a second transfer gate AFTRG25.

The first transfer gate AFTRG15 and the second transfer gate AFTRG25 are electrically connected by a connection electrode CEL15.

Further, the connection electrode CEL15 connecting the first transfer gate AFTRG15 and the second transfer gate AFTRG25 is connected to the transfer control line LTR1 along which the transfer control signal TR1 is carried.

Consequently, the first transfer gate AFTRG15 and the second transfer gate AFTRG25 are controlled to be simultaneously turned on and off in parallel by the same transfer control signal TR1.

The first imaging pixel 200-31 of the third row, first column and the second imaging pixel 200-41 of the fourth row, first column share a floating diffusion layer FDC31 as an output node. Further, the first imaging pixel 200-31 and the second imaging pixel 200-41 also share a reset transistor TRST, an amplification transistor TAMP, and a selection transistor TSEL.

The first imaging pixel 200-31 has a first transfer gate TRG31, and the second imaging pixel 200-41 has a second transfer gate TRG41.

The first transfer gate TRG31 is connected to a transfer control line LTR3 along which a transfer control signal TR3 is carried.

The second transfer gate TRG41 is connected to a transfer control line LTR4 along which a transfer control signal TR4 is carried.

Consequently, the first transfer gate TRG31 and the second transfer gate TRG41 are controlled to be individually turned on and off by different transfer control signals TR3 and TR4.

The first imaging pixel 200-32 of the third row, second column and the second imaging pixel 200-42 of the fourth row, second column share a floating diffusion layer FDC32 as an output node. Further, the first imaging pixel 200-32 and the second imaging pixel 200-42 also share a reset transistor TRST, an amplification transistor TAMP, and a selection transistor TSEL.

The first imaging pixel 200-32 has a first transfer gate TRG32, and the second imaging pixel 200-42 has a second transfer gate TRG42.

The first transfer gate TRG32 is connected to the transfer control line LTR3 along which the transfer control signal TR3 is carried.

The second transfer gate TRG42 is connected to the transfer control line LTR4 along which the transfer control signal TR4 is carried.

Consequently, the first transfer gate TRG32 and the second transfer gate TRG42 are controlled to be individually turned on and off by different transfer control signals TR3 and TR4.

The first imaging pixel 200-33 of the third row, third column and the second imaging pixel 200-43 of the fourth row, third column share a floating diffusion layer FDC33 as an output node. Further, the first imaging pixel 200-33 and the second imaging pixel 200-43 also share a reset transistor TRST, an amplification transistor TAMP, and a selection transistor TSEL.

The first imaging pixel 200-33 has a first transfer gate TRG33, and the second imaging pixel 200-43 has a second transfer gate TRG43.

The first transfer gate TRG33 is connected to the transfer control line LTR3 along which the transfer control signal TR3 is carried.

The second transfer gate TRG43 is connected to the transfer control line LTR4 along which the transfer control signal TR4 is carried.

Consequently, the first transfer gate TRG33 and the second transfer gate TRG43 are controlled to be individually turned on and off by different transfer control signals TR3 and TR4.

The first imaging pixel 200-34 of the third row, fourth column and the second imaging pixel 200-44 of the fourth row, fourth column share a floating diffusion layer FDC34 as an output node. Further, the first imaging pixel 200-34 and the second imaging pixel 200-44 also share a reset transistor TRST, an amplification transistor TAMP, and a selection transistor TSEL.

The first imaging pixel 200-34 has a first transfer gate TRG34, and the second imaging pixel 200-44 has a second transfer gate TRG44.

The first transfer gate TRG34 is connected to the transfer control line LTR3 along which the transfer control signal TR3 is carried.

The second transfer gate TRG44 is connected to the transfer control line LTR4 along which the transfer control signal TR4 is carried.

Consequently, the first transfer gate TRG34 and the second transfer gate TRG44 are controlled to be individually turned on and off by different transfer control signals TR3 and TR4.

The first imaging pixel 200-35 of the third row, fifth column and the second imaging pixel 200-45 of the fourth row, fifth column share a floating diffusion layer FDC35 as an output node. Further, the first imaging pixel 200-35 and the second imaging pixel 200-45 also share a reset transistor TRST, an amplification transistor TAMP, and a selection transistor TSEL.

The first imaging pixel 200-35 has a first transfer gate TRG35, and the second imaging pixel 200-45 has a second transfer gate TRG45.

The first transfer gate TRG35 is connected to the transfer control line LTR3 along which the transfer control signal TR3 is carried.

The second transfer gate TRG45 is connected to the transfer control line LTR4 along which the transfer control signal TR4 is carried.

Consequently, the first transfer gate TRG35 and the second transfer gate TRG45 are controlled to be individually turned on and off by different transfer control signals TR3 and TR4.

[Circuit Configuration Example of 2-Pixel-Sharing Imaging Pixels and Focus Detection Pixels]

Next, a configuration example of a circuit of an imaging pixel and a focus detection pixel for a 2-pixel-sharing case will be described.

Figure 5:
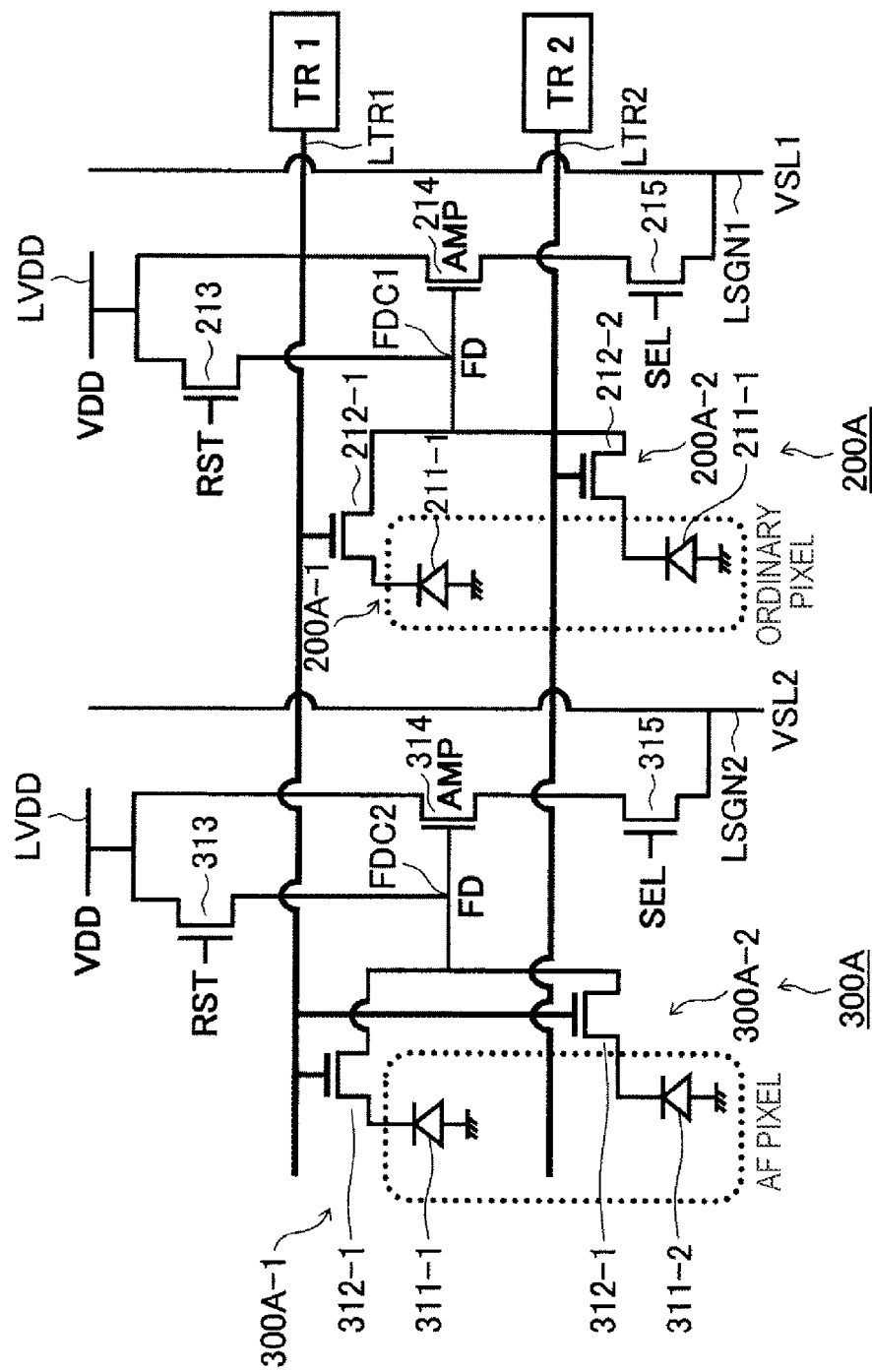
FIG. 5 is a diagram illustrating a configuration example of a circuit of an imaging pixel and a focus detection pixel for a 2-pixel-sharing case according to an embodiment of the present technology.

FIG. 5 is a diagram illustrating a configuration example of a circuit of an imaging pixel and a focus detection pixel for a 2-pixel-sharing case according to an embodiment of the present technology.

FIG. 5 illustrates an example of the pixels in a CMOS image sensor basically configured from four transistors.

A 2-pixel-sharing imaging pixel 200A has a photodiode (PD) 211-1 as a photoelectric conversion unit of a first imaging pixel 200A-1 and a transfer transistor 212-1 as a transfer gate.

The imaging pixel 200A has a photodiode (PD) 211-2 as a photoelectric conversion unit of a second imaging pixel 200A-2 and a transfer transistor 212-2 as a transfer gate.

The imaging pixel 200A has a floating diffusion layer FDC1 as an output node that is shared by the first imaging pixel 200A-1 and the second imaging pixel 200A-2.

The imaging pixel 200A also has a reset transistor (TRST) 213, an amplification transistor (TAMP) 214, and a selection transistor (TSEL) 215.

The photodiodes 211-1 and 211-2 photoelectrically convert incident light into charges (here, electrons) based on the amount of incident light.

At the first imaging pixel 200A-1, the transfer transistor 212-1 as a transfer element (transfer gate) is connected between the photodiode 211-1 and the floating diffusion layer FDC1 as an output node. A transfer control signal TR1 is applied to the gate (transfer gate) of the transfer transistor 212-1 via the transfer control line LTR1.

Consequently, the transfer transistor 212-1 transfers the electrons photoelectrically converted by the photodiode 211-1 to the floating diffusion layer FDC 1.

At the second imaging pixel 200A-2, the transfer transistor 212-2 as a transfer element (transfer gate) is connected between the photodiode 211-2 and the floating diffusion layer FDC1 as an output node. A transfer control signal TR2 is applied to the gate (transfer gate) of the transfer transistor 212-2 via the transfer control line LTR2.

Consequently, the transfer transistor 212-2 transfers the electrons photoelectrically converted by the photodiode 211-2 to the floating diffusion layer FDC1.

The reset transistor 213 is connected between a power supply line LVDD, which a power supply voltage VDD is supplied to, and the floating diffusion layer FDC1. A reset signal RST is applied to the gate of the reset transistor via a reset control line LRST.

Consequently, the reset transistor 213 as a reset element resets the electric potential of the floating diffusion layer FDC1 to the electric potential of the power supply line LVDD.

A gate of the amplification transistor 214 acting as an amplification element is connected to the floating diffusion layer FDC1. Namely, the floating diffusion layer FDC1 can also function as an input node of the amplification transistor 214 acting as an amplification element.

The amplification transistor 214 and the selection transistor 215 are connected in series between the power supply line LVDD to which a power supply voltage VDD is supplied and a signal line LSGN1.

Thus, the amplification transistor 214 is connected to the signal line LSGN1 via the selection transistor 215, thereby configuring a constant current source external to the pixel portion and a source follower.

Further, the selection transistor 215 is turned on when a selection signal SEL, which is a control signal based on an address signal, is applied to the selection transistor 215 gate via the selection control line LSEL.

When the selection transistor 215 is tuned on, the amplification transistor 214 amplifies the electric potential of the floating diffusion layer FDC1, and outputs a voltage based on that amplified electric potential to a signal line LSGL1. The voltage VSL1 output from each pixel is output to the column read circuit 130 via the signal line LSGL1.

These operations are simultaneously performed for each pixel in 12 rows of pixels, because, for example, the respective gates of the transfer transistors 212-1 and 212-2, the reset transistor 213, and the selection transistor 215 are connected in row units.

A 2-pixel-sharing focus detection pixel 300A has a photodiode (PD) 311-1 as a photoelectric conversion unit of a first focus detection pixel 300A-1 and a transfer transistor 312-1 as a transfer gate.

The focus detection pixel 300A has a photodiode (PD) 311-2 as a photoelectric conversion unit of a second focus detection pixel 300A-2 and a transfer transistor 312-2 as a transfer gate.

The focus detection pixel 300A has a floating diffusion layer FDC2 as an output node that is shared by the first focus detection pixel 300A-1 and the second focus detection pixel 300A-2.

The focus detection pixel 300A also has a reset transistor (TRST) 313, an amplification transistor (TAMP) 314, and a selection transistor (TSEL) 315.

The photodiodes 311-1 and 311-2 photoelectrically convert incident light into charges (here, electrons) based on the amount of incident light.

At the first focus detection pixel 300A-1, the transfer transistor 312-1 as a transfer element (transfer gate) is connected between the photodiode 311-1 and the floating diffusion layer FDC2 as an output node. The transfer control signal TR1 is applied to the gate (transfer gate) of the transfer transistor 312-1 via the transfer control line LTR1.

Consequently, the transfer transistor 312-1 transfers the electrons photoelectrically converted by the photodiode 311-1 to the floating diffusion layer FDC2.

At the second focus detection pixel 300A-2, the transfer transistor 312-2 as a transfer element (transfer gate) is connected between the photodiode 311-2 and the floating diffusion layer FDC2 as an output node. The transfer control signal TR1 is applied to the gate (transfer gate) of the transfer transistor 312-2 via the transfer control line LTR1.

Consequently, the transfer transistor 312-2 transfers the electrons photoelectrically converted by the photodiode 311-2 to the floating diffusion layer FDC2.

The reset transistor 313 is connected between a power supply line LVDD, which a power supply voltage VDD is supplied to, and the floating diffusion layer FDC2. A reset signal RST is applied to the gate of the reset transistor via a reset control line LRST.

Consequently, the reset transistor 313 as a reset element resets the electric potential of the floating diffusion layer FDC2 to the electric potential of the power supply line LVDD.

A gate of the amplification transistor 314 acting as an amplification element is connected to the floating diffusion layer FDC2. Namely, the floating diffusion layer FDC2 can also function as an input node of the amplification transistor 314 acting as an amplification element.

The amplification transistor 314 and the selection transistor 315 are connected in series between the power supply line LVDD to which a power supply voltage VDD is supplied and a signal line LSGN2.

Thus, the amplification transistor 214 is connected to a signal line LSGN2 via the selection transistor 315, thereby configuring a constant current source external to the pixel portion and a source follower.

Further, the selection transistor 315 is turned on when the selection signal SEL, which is a control signal based on an address signal, is applied to the selection transistor 315 gate via the selection control line LSEL.

When the selection transistor 315 is tuned on, the amplification transistor 314 amplifies the electric potential of the floating diffusion layer FDC2, and outputs a voltage based on that amplified electric potential to a signal line LSGL2. The voltage VSL2 output from each pixel is output to the column read circuit 130 via the signal line LSGL2.

These operations are simultaneously performed for each pixel in 2 rows worth of focus detection pixels, because, for example, the respective gates of the transfer transistors 312-1 and 312-2, the reset transistor 313, and the selection transistor 315 are connected in row units.

The reset control line LRST, the transfer control line LTR, and the selection control line LSEL wired in the pixel array portion 110 are wired as a set in each row unit of the pixel array.

M number of the LRST, LTRG, and LSEL control lines are provided, respectively.

The reset control line LRST, the transfer control line LTR, and the selection control line LSEL are driven by the row selection circuit 120.

The row selection circuit 120 controls operation of the pixels arranged in an arbitrary row among the pixel array portion 110. The row selection circuit 120 controls the pixels via the control lines LRST, LTRG, and LSEL.

The column read circuit 130 receives via the signal output line LSGN the data of a pixel row read and controlled by the row selection circuit 120, and transfers the received data to a latter-stage signal processing circuit.

The column read circuit 130 can also include a CDS (correlated double sampling) circuit and an ADC (analog digital converter).

As described above, the solid-state image sensor 100 according to an embodiment of the present technology includes a pair of phase difference focus detection pixels (AF pixels) 300A-1 and 300A-2.

The pair of first and second focus detection pixels 300A-1 and 300A-2 share the floating diffusion layer FDC2, and are configured so that the gates of the transfer transistors 312-1 and 312-2 acting as transfer gates are connected to a shared transfer control line LTR1.

Therefore, when an ON pulse is input to one transfer control line LTR1, the two pixels simultaneously turn on the transfer transistors 312-1 and 312-2 acting as transfer gates.

Consequently, the electrons accumulated in the photodiode 311-1 of the first focus detection pixel 300A-1 and the electrons accumulated in the photodiode 311-2 of the second focus detection pixel 300A-2 are transferred simultaneously and in parallel to the floating diffusion layer FDC2.

Further, these electrons are added up as a signal by the floating diffusion layer FDC2.

Consequently, the signal level (sensitivity) of the focus detection pixels improves, so that focus detection accuracy during low illumination can be improved.

Since the photoelectric conversion unit (PD unit) of the focus detection pixels 300 can be configured with the same layout as the ordinary imaging pixels 200, compared with the problems (miniaturization) that can occur in JP 2008-103885A, the present technology can achieve better miniaturization and is more advantageous.

Further, in this embodiment of the present technology, since the focus detection pixels are subjected to FD addition based on an ordinary driving method, there is no need to change the drive method for the FD addition of the focus detection pixels.

Further, since the ordinary imaging pixels 200 are wired and connected in a typical manner, the imaging pixels can be read row by row.

An example was described above of the overall schematic configuration, pixel array, and 2-pixel-sharing imaging pixel and focus detection pixel circuit configuration of the solid-state image sensor 100 according to an embodiment of the present technology.

Although some parts will overlap, specific examples of a pixel sharing configuration that can be applied to the present technology, light shielding of the focus detection pixels, provision of a color filter, pixel arrays and the like will now be described as first to sixth embodiments.

2. First Embodiment

FIGS. 6(A) and 6(B) are diagrams illustrating a configuration example of vertical 2-pixel-sharing as a first embodiment of the present technology.

FIG. 6(A) illustrates a vertical 2-pixel-sharing pattern of ordinary imaging pixels, and FIG. 6(B) illustrates a vertical 2-pixel-sharing pattern of focus detection pixels.

Figure 6:
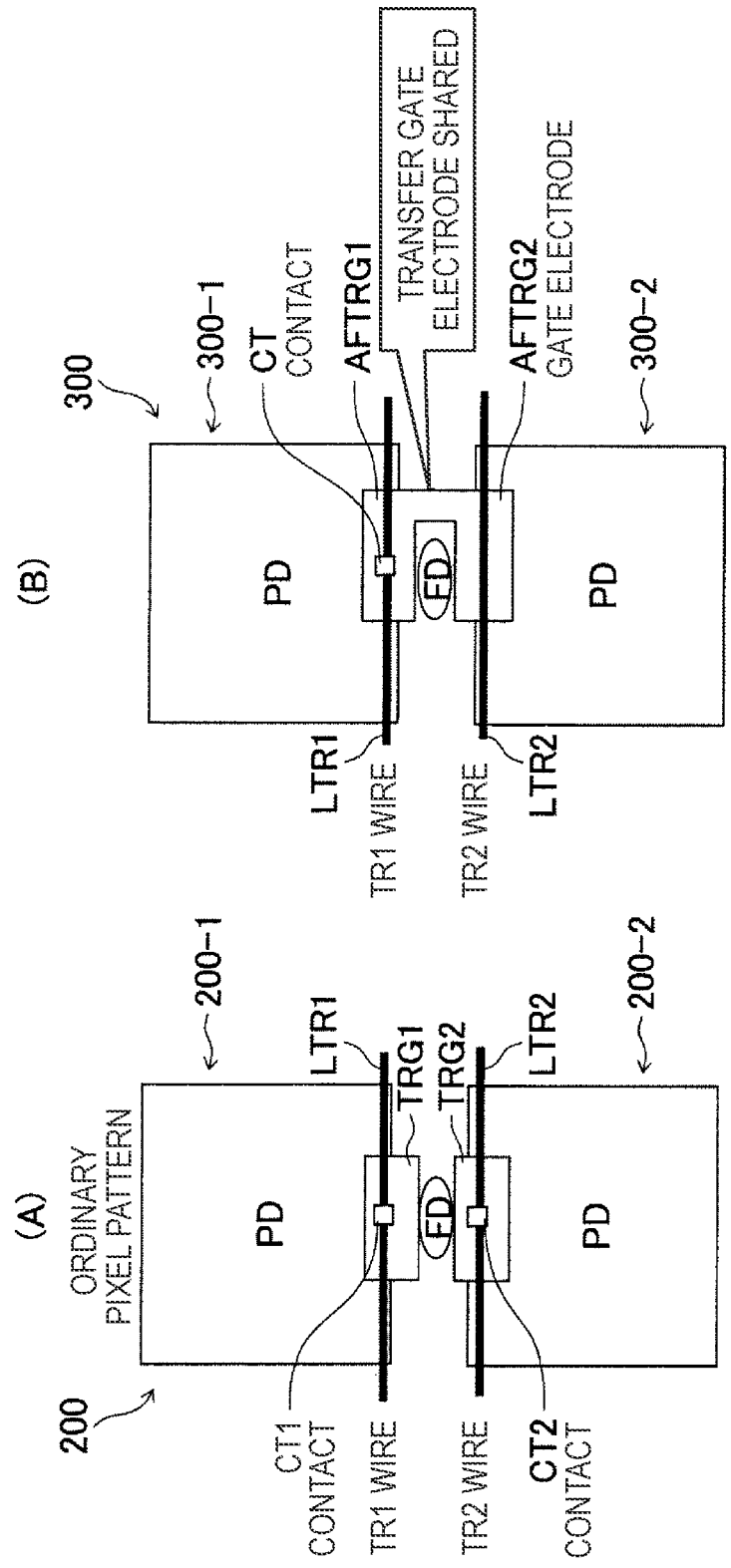
FIG. 6 is a diagram illustrating a configuration example of vertical 2-pixel sharing as a first embodiment of the present technology.

The first embodiment illustrated in FIG. 6 illustrates a configuration of a vertical 2-pixel-sharing pattern that has the same pixel array as described with reference to FIG. 4. For ease of understanding, parts that are the same as in FIG. 4 are represented using the same reference numerals.

In FIG. 6, the photodiode (PD) photoelectric conversion unit, the floating diffusion layer FD, the gate electrodes, and the transfer control line LTR wires are simply illustrated.

Further, although for convenience the contacts connecting the FD layers and the wires are not illustrated, in order for the FD portions to be reset, the FD portions are electrically connected to the source side of the reset transistor TRST.

As illustrated in FIGS. 6(A) and 6(B), the solid-state image sensor 100 is configured so that the transfer gates AFTG1 and AFTG2 are shared by, among the imaging pixels 200 and focus detection pixels 300, only the pair of first and second focus detection pixels 300-1 and 300-2.

Namely, the first focus detection pixel 300-1 and the second focus detection pixel 300-2 share a floating diffusion layer FD, and share a gate electrode of the first and second transfer gates (transistors) that transfer the accumulated electrons in the photoelectric conversion units PD to the FD layer.

Specifically, the first transfer gate of the first focus detection pixel 300-1 and the second transfer gate of the second focus detection pixel 300-2 are controlled to be simultaneously turned on and off in parallel by a shared transfer control signal TR1.

For example, at a high level, the transfer control signal TR1 turns the two transfer gates on, so that the electrons accumulated in the photoelectric conversion units PD of the pair of the first focus detection pixel 300-1 and the second focus detection pixel 300-2 are transferred to a shared FD layer, and subjected to FD addition.

Consequently, a signal level similar to the ordinary imaging pixels 200-1 and 200-2 can be obtained.

The ordinary imaging pixels 200 are configured so that a floating diffusion layer FD is shared between two adjacent pixels, but the transfer gate (transistor) gate electrodes are individually formed.

Namely, the first transfer gate of the first focus detection pixel 300-1 and the second transfer gate of the second focus detection pixel 300-2 are controlled to be individually turned on and off by different transfer control signals TR1 and TR2.

Therefore, the signals from each of the imaging pixels 200 can be individually read.

3. Second Embodiment

Figure 7:
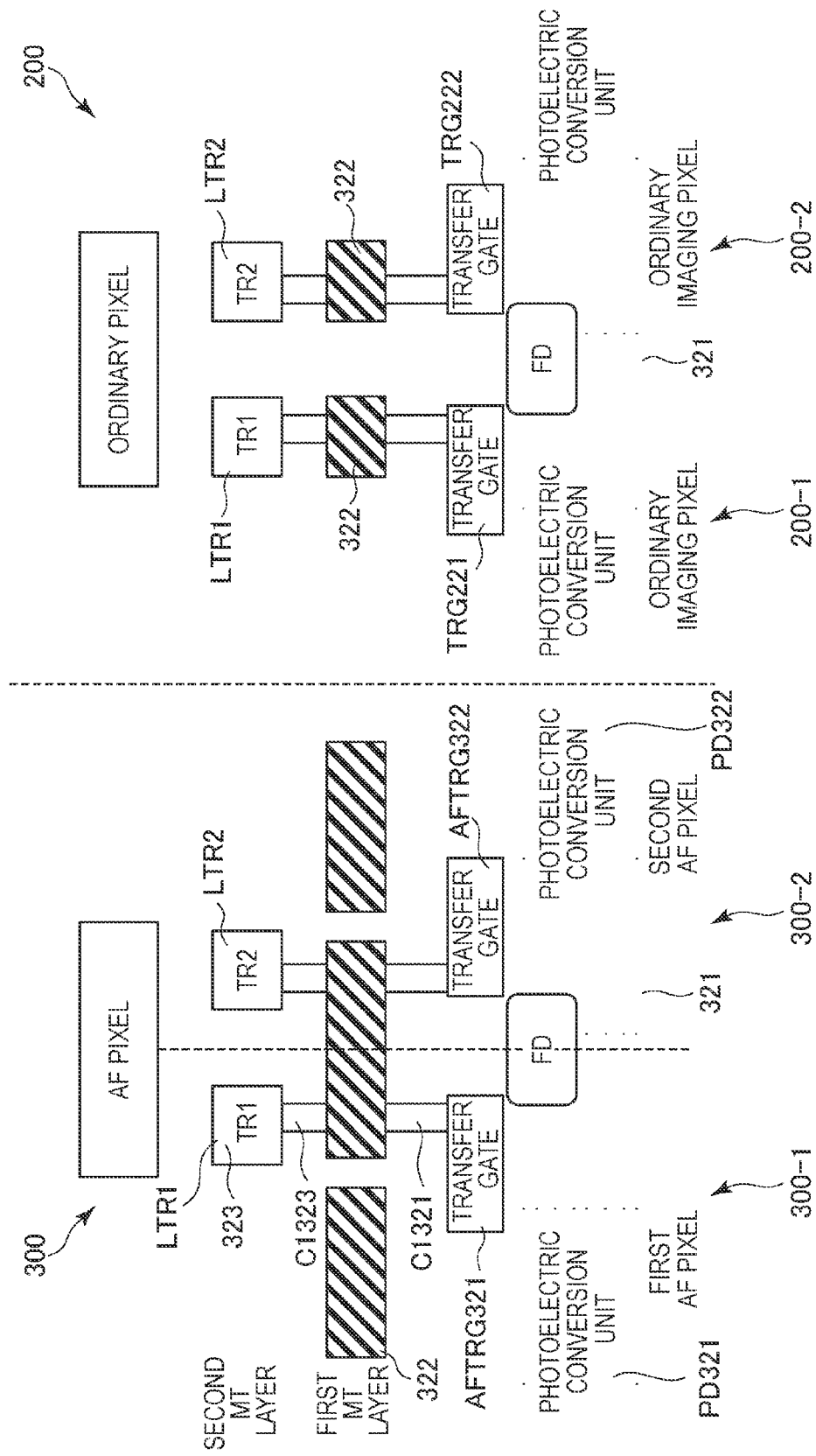
FIG. 7 is a diagram illustrating a configuration example of a 2-pixel-sharing transfer wire as a second embodiment of the present technology, which illustrates a laminate structure of an FD-layer-sharing imaging pixel and focus detection pixel.
Figure 8:
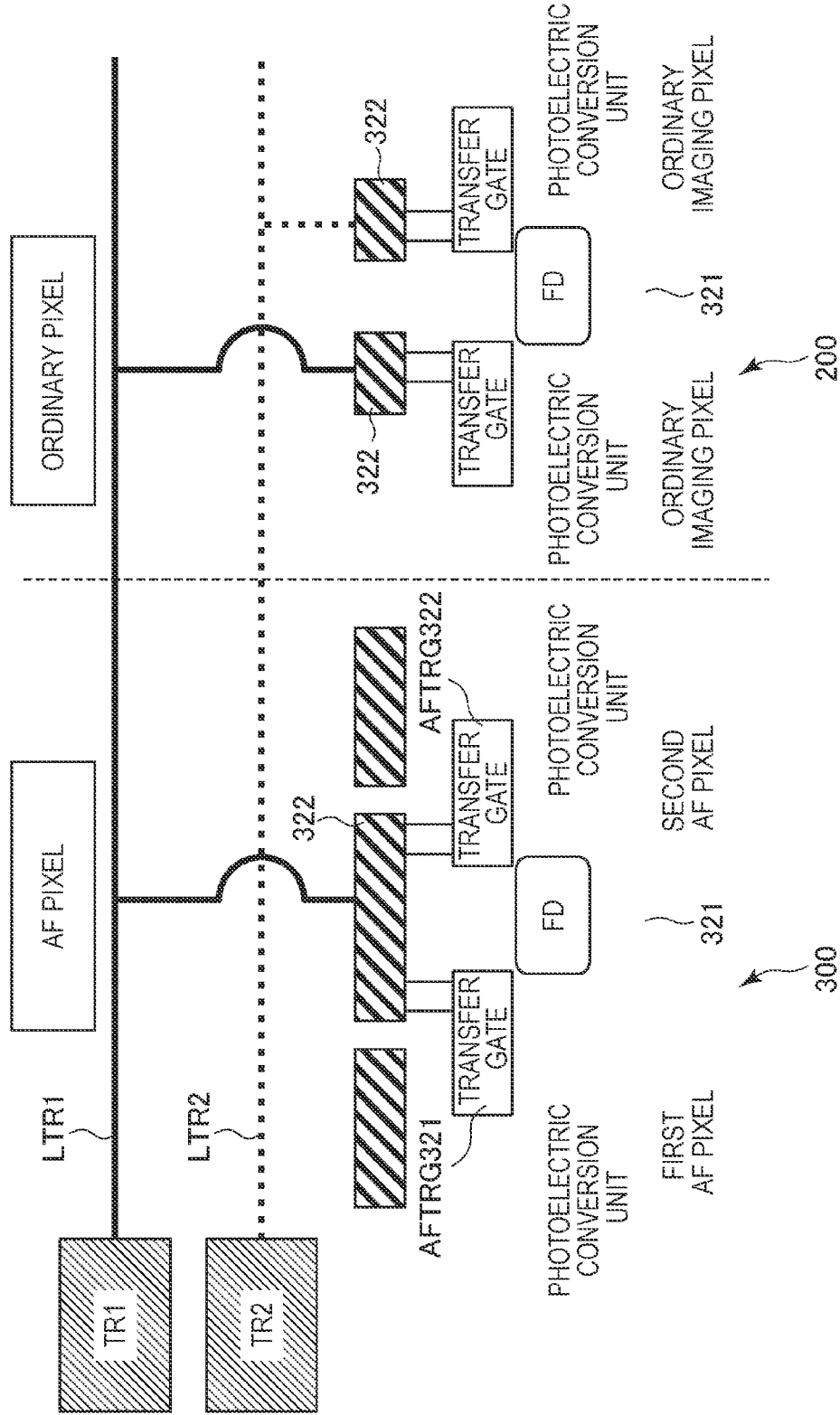
FIG. 8 is a diagram illustrating a configuration example of a 2-pixel-sharing transfer wire as a second embodiment of the present technology, which schematically illustrates a wire connection in the laminate structure illustrated in FIG. 7.

FIGS. 7 and 8 are diagrams illustrating a configuration example of a 2-pixel-sharing transfer wire as a second embodiment of the present technology.

FIG. 7 illustrates a laminate structure of an FD-layer-sharing imaging pixel and focus detection pixel. FIG. 8 schematically illustrates a wire connection in the laminate structure illustrated in FIG. 7.

Focus detection pixels 300-1 and 300-2 are configured so that photoelectric conversion units PD321 and PD322, transfer gates AFTRG321 and AFTRG322, and a shared floating diffusion layer FD321 are formed on a semiconductor substrate (silicon substrate) 321.

The transfer gates AFTRG321 and AFTRG322 are raised by a contact CT321 and connected to an intermediate electrode layer 322, which is a first metal layer of an upper layer.

This intermediate electrode layer 322 is itself raised by a contact CT322 and connected to a transfer control line LTRG1 that is formed from a second metal layer 323 of an upper layer.

In this example, the intermediate electrode layer 322 is not connected to the transfer control line LTR2, which is formed from a second metal layer 324 for the transfer control signal TR2.

Even in this configuration, the pair of first and second focus detection pixels 300-1 and 300-2 is only subject to one transfer control signal TR1, so that when the transfer control signal TR1 is at a high level, the two transfer gates are turned on.

Consequently, the electrons accumulated in the photoelectric conversion units PD321 and PD322 of the pair of the first focus detection pixel 300-1 and the second focus detection pixel 300-2 are transferred to a shared FD layer, and subjected to FD addition.

As a result, a signal level similar to the ordinary imaging pixels 200-1 and 200-2 can be obtained.

Figure 9:
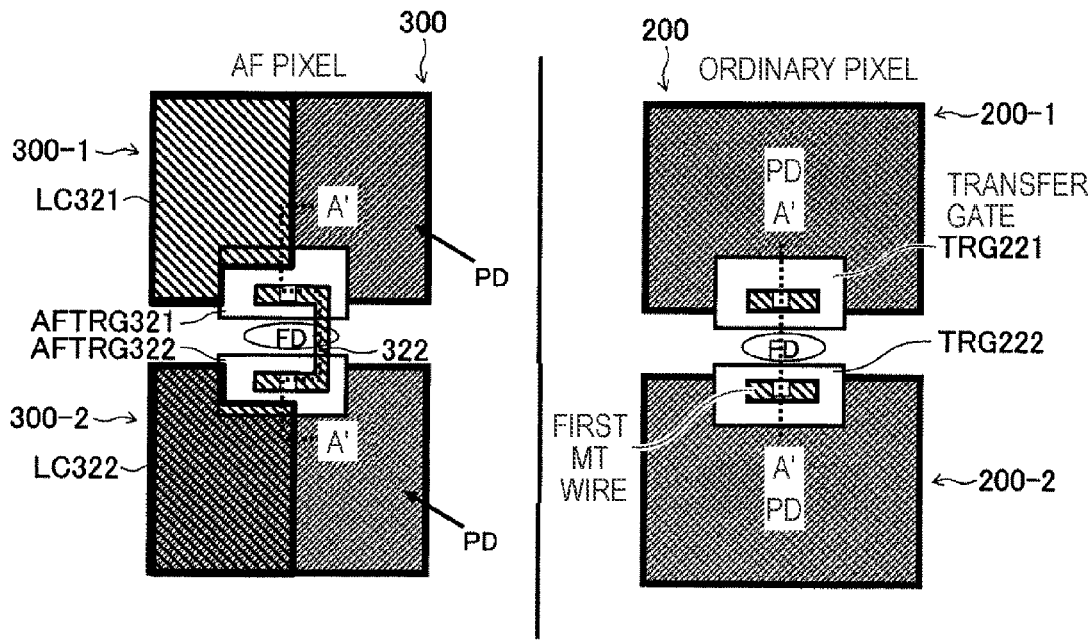
FIG. 9 is a diagram schematically illustrating in a planar manner a configuration example of a 2-pixel-sharing transfer wire as a second embodiment of the present technology, which schematically illustrates a pixel pattern, which includes a first metal wire layer that is formed from a Si substrate, of an FD-layer-sharing imaging pixel and focus detection pixel.
Figure 10:
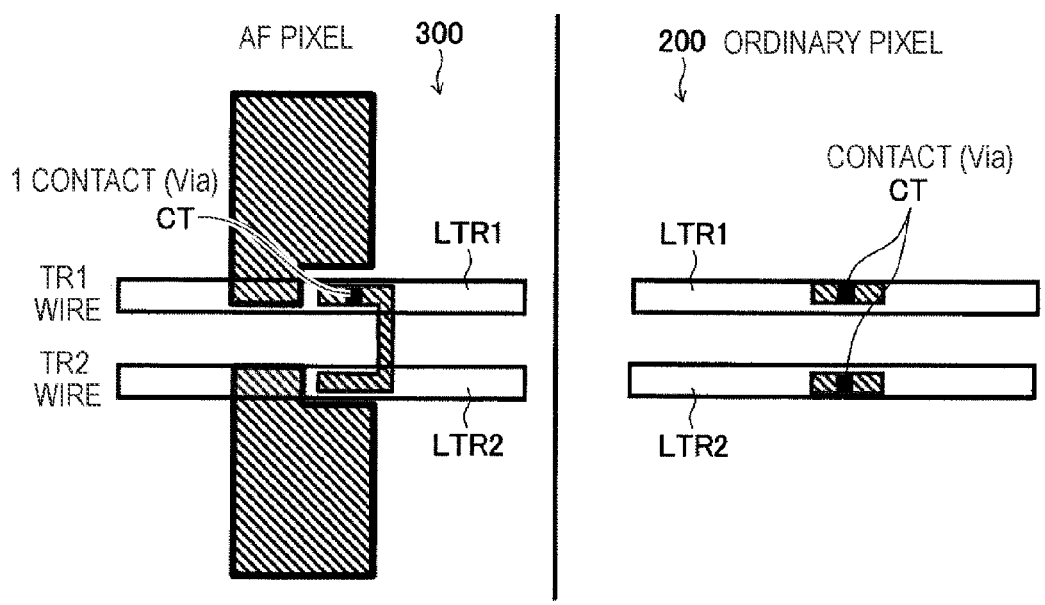
FIG. 10 is a diagram schematically illustrating in a planar manner a configuration example of a 2-pixel-sharing transfer wire as a second embodiment of the present technology, which schematically illustrates a pixel pattern including a first metal wire layer and a second metal wire layer.

FIGS. 9 and 10 are diagrams schematically illustrating in a planar manner a configuration example of a 2-pixel-sharing transfer wire as a second embodiment of the present technology.

FIG. 9 schematically illustrates a pixel pattern, which includes a first metal wire layer that is formed from a Si substrate, of an FD-layer-sharing imaging pixel and focus detection pixel. FIG. 10 schematically illustrates a pixel pattern including a first metal wire layer and a second metal wire layer.

In FIGS. 9 and 10, for convenience the contacts connecting the FD layers and the wires are not illustrated.

As illustrated in FIG. 9, at the focus detection pixels 300-1 and 300-2, light shielding portions LC321 and LC322 for shielding the light incident on the photoelectric conversion units PD321 and PD322 are formed from a metal in the same layer as the intermediate electrode layer 322, which is a first metal layer.

In this example, the light shielding portions LC321 and LC322 are formed so as to shield roughly half of the area where light is incident on the photoelectric conversion units PD321 and PD322. This example illustrates left shielded light as an example.

Therefore, the ordinary imaging pixels 200-1 and 200-2 are configured so that even though a part of the area where light is incident on the photoelectric conversion unit is shielded, the light incident area is larger than that of the focus detection pixels 300-1 and 300-2. In other words, the imaging pixels 200 have a larger aperture size than the aperture size of the focus detection pixels.

However, in this embodiment of the present technology, the ordinary imaging pixels 200 and the focus detection pixels 300 have the same pixel size.

Further, as illustrated in FIGS. 9 and 10, the transfer gates and the first metal wire layer are connected by a contact (via) CT321, and the first metal wire layer and the second metal layer are connected by a contact CT322.

4. Third Embodiment

Figure 11:
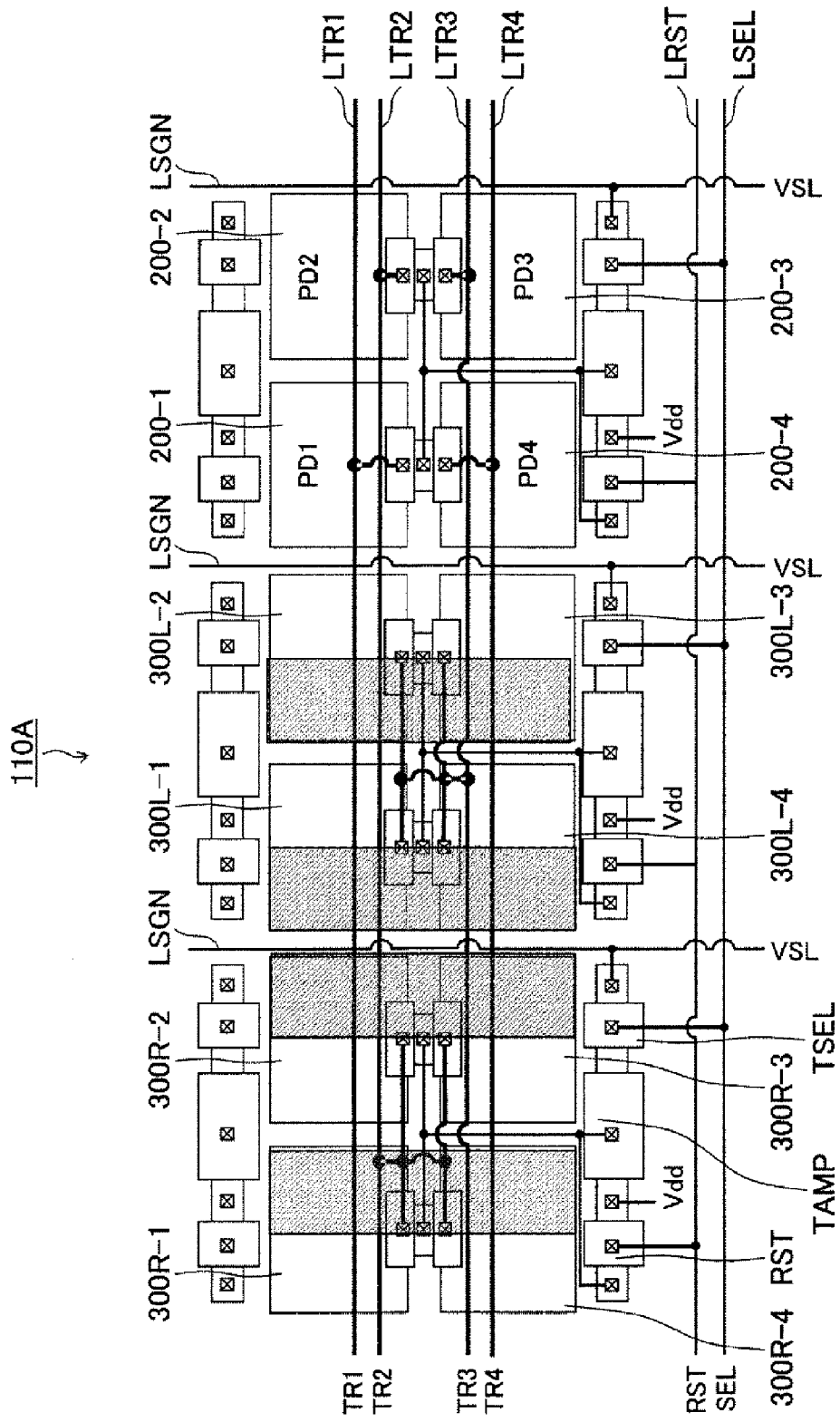
FIG. 11 is a diagram illustrating a 4-pixel-sharing pixel array example as a third embodiment of the present technology.

FIG. 11 is a diagram illustrating a 4-pixel-sharing pixel array example as a third embodiment of the present technology.

FIG. 11 illustrates a 2×2-pixel-sharing (4-pixel unit) case.

Ordinary imaging pixels 200-1 to 200-4, which include photoelectric conversion units PD221 to PD224, are configured so that when a pulse is input in the order of TR1→TR2→TR3→TR4 to the transfer control lines LTR1, LTR2, LTR3, and LTR4, transfer gates TRG1 to TRG4 are turned on/off in order.

Based on this operation, the signals from the pixels can be read pixel by pixel.

In the example illustrated in FIG. 11, the focus detection pixels 300-1 to 300-4 are configured so that the transfer gate is connected to only the transfer control line LTR2.

When a pulse as the transfer control signal TR2 is applied to the transfer control line LTR2, the transfer gates of the four (2×2) focus detection pixels 300-1 to 300-4 are simultaneously turned on, and four pixels worth of signals is added by the floating diffusion layer FD.

5. Fourth Embodiment

Figure 12:
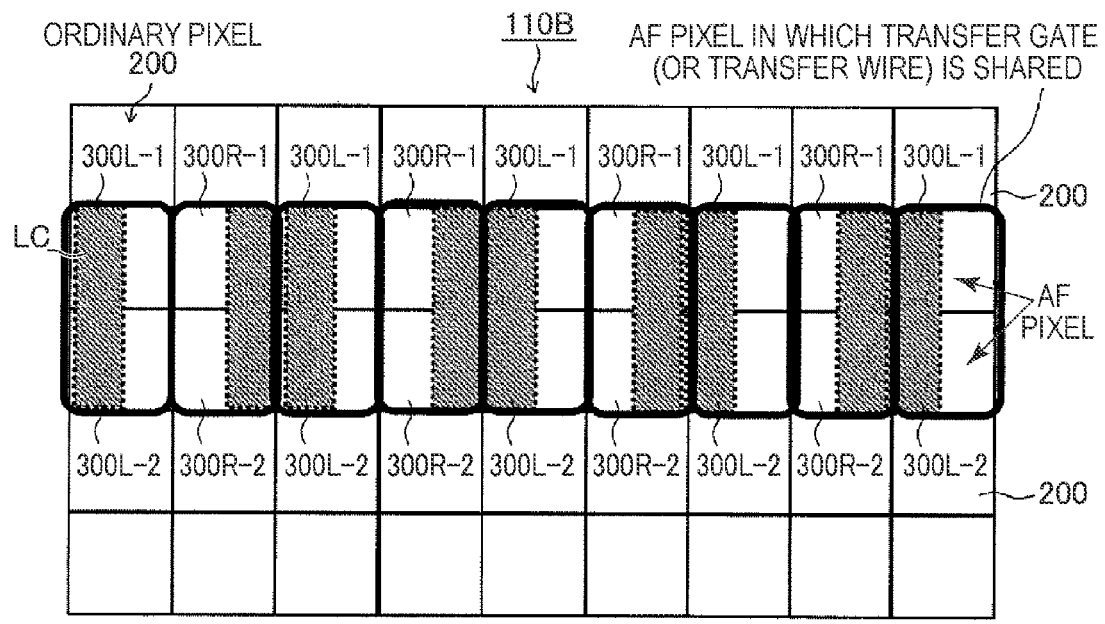
FIG. 12 is a diagram illustrating, for a 2-pixel-sharing case, a first example of a light shielding pattern of the focus detection pixels arranged in a pixel array portion as a fourth embodiment of the present technology.

FIG. 12 is a diagram illustrating, for a 2-pixel-sharing case, a first example of a light shielding pattern of the focus detection pixels arranged in a pixel array portion as a fourth embodiment of the present technology.

FIG. 12 illustrates an example in which left and right light-shielded focus detection pixels 300 are arranged on a part of a pixel array portion 110B.

In this example, left light-shielded, vertical 2-pixel-sharing focus detection pixels 300L-1 and 300L-2 and right light-shielded, vertical 2-pixel-sharing focus detection pixels 300R-1 and 300R-2 are alternately arranged.

Further, although FIG. 12 is illustrated as if there are focus detection pixels consecutively arranged in the horizontal direction in the diagram, the focus detection pixels do not have to be consecutively arranged. For example, as illustrated in FIG. 4, ordinary imaging pixels may be arranged in between.

Figure 13:
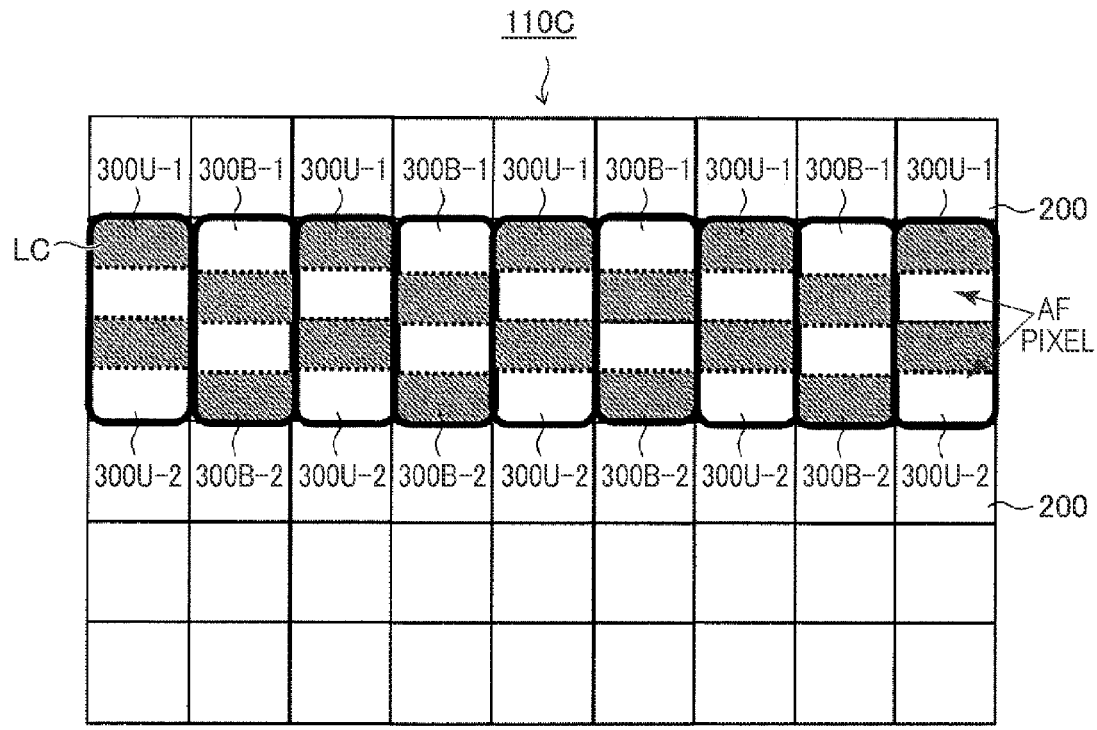
FIG. 13 is a diagram illustrating, for a 2-pixel-sharing case, a second example of a light shielding pattern of the focus detection pixels arranged in a pixel array portion as a fourth embodiment of the present technology.

FIG. 13 is a diagram illustrating, for a 2-pixel-sharing case, a second example of a light shielding pattern of the focus detection pixels arranged in a pixel array portion as a fourth embodiment of the present technology.

FIG. 13 illustrates an example in which upper and bottom light-shielded focus detection pixels 300 are arranged on a part of a pixel array portion 110C.

In this example, upper light-shielded, vertical 2-pixel-sharing focus detection pixels 300U-1 and 300U-2 and bottom light-shielded, vertical 2-pixel-sharing focus detection pixels 300B-1 and 300B-2 are alternately arranged.

Further, although FIG. 13 is illustrated as if there are focus detection pixels consecutively arranged in the horizontal direction in the diagram, the focus detection pixels do not have to be consecutively arranged. For example, as illustrated in FIG. 4, ordinary imaging pixels may be arranged in between.

Figure 14:
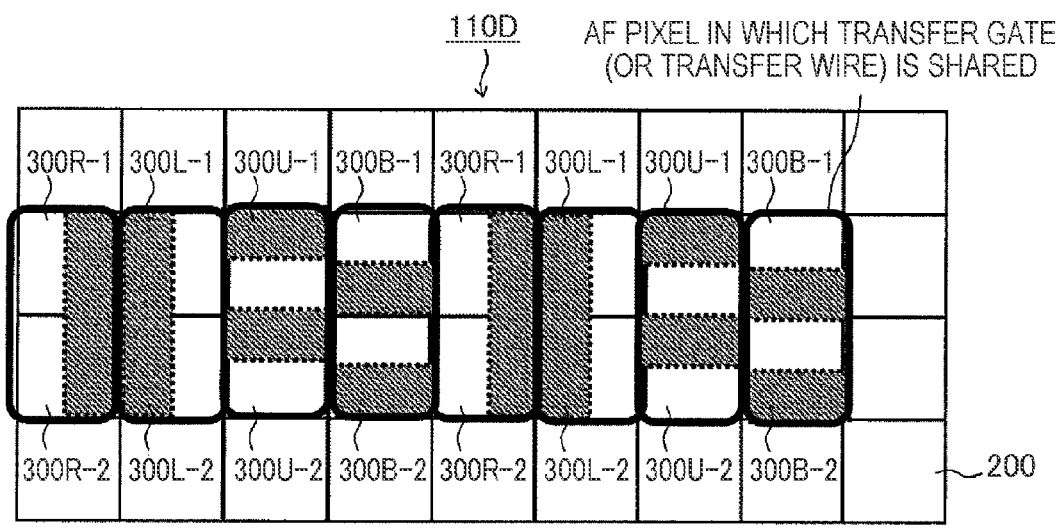
FIG. 14 is a diagram illustrating, for a 2-pixel-sharing case, a third example of a light shielding pattern of the focus detection pixels arranged in a pixel array portion as a fourth embodiment of the present technology.

FIG. 14 is a diagram illustrating, for a 2-pixel-sharing case, a third example of a light shielding pattern of the focus detection pixels arranged in a pixel array portion as a fourth embodiment of the present technology.

FIG. 14 illustrates an example in which upper and bottom light-shielded focus detection pixels 300 are arranged on a part of a pixel array portion 110D.

In this example, right light-shielded, vertical 2-pixel-sharing focus detection pixels 300R-1 and 300R-2 and left light-shielded, vertical 2-pixel-sharing focus detection pixels 300L-1 and 300L-2 are arranged.

Further, in the example illustrated in FIG. 14, upper light-shielded, vertical 2-pixel-sharing focus detection pixels 300U-1 and 300U-2 and bottom light-shielded, vertical 2-pixel-sharing focus detection pixels 300B-1 and 300B-2 are alternately arranged.

Namely, in the example illustrated in FIG. 14, left- and right-light-shielded and upper and bottom light-shielded focus detection pixels are arranged in an intermingled manner.

Further, although FIG. 14 is illustrated as if there are focus detection pixels consecutively arranged in the horizontal direction in the diagram, the focus detection pixels do not have to be consecutively arranged. For example, as illustrated in FIG. 4, ordinary imaging pixels may be arranged in between.

In addition, although ordinary imaging pixels are arranged in the vertical direction, left and right light-shielded and upper and bottom light-shielded may be adjacent to each other.

FIGS. 15(A) to 15(D) are diagrams illustrating, for a 2-pixel-sharing case, a fourth example of a light shielding pattern of the focus detection pixels arranged in a pixel array portion as a fourth embodiment of the present technology.

This fourth example of light shielding is an example of slanted light shielding.

FIG. 15(A) illustrates focus detection pixels 300LU-1 and 300LU-2 in which a left upper corner is shielded.

FIG. 15(B) illustrates focus detection pixels 300RU-1 and 300RU-2 in which a right upper corner is shielded.

FIG. 15(C) illustrates focus detection pixels 300LB-1 and 300LB-2 in which a left bottom corner is shielded.

FIG. 15(D) illustrates focus detection pixels 300RB-1 and 300RB-2 in which a right bottom corner is shielded.

Figure 16:
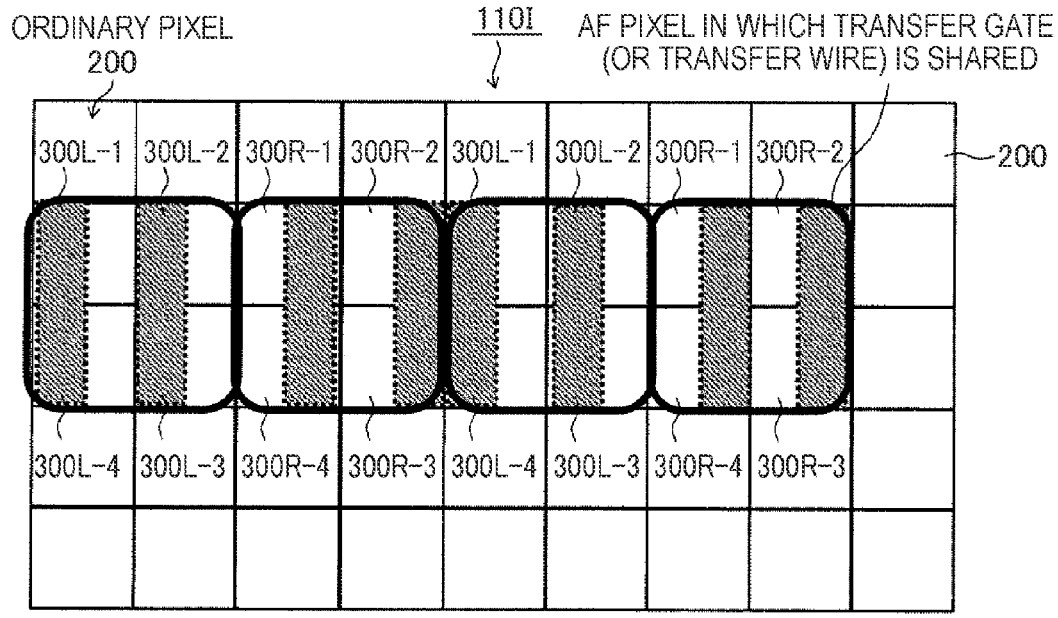
FIG. 16 is a diagram illustrating, for a 4-pixel-sharing case, a first example of a light shielding pattern of the focus detection pixels arranged in a pixel array portion as a fourth embodiment of the present technology.

FIG. 16 is a diagram illustrating, for a 4-pixel-sharing case, a first example of a light shielding pattern of the focus detection pixels arranged in a pixel array portion as a fourth embodiment of the present technology.

FIG. 16 illustrates an example in which left and right light-shielded focus detection pixels 300 are arranged on a part of a pixel array portion 110I.

In this example, left light-shielded, vertical 4-pixel-sharing focus detection pixels 300L-1, 300L-2, 300L-2, and 300L-4 and right light-shielded, vertical 4-pixel-sharing focus detection pixels 300R-1, 300R-2, 300R-2, and 300R-4 are arranged.

Further, although FIG. 16 is illustrated as if there are focus detection pixels consecutively arranged in the horizontal direction in the diagram, the focus detection pixels do not have to be consecutively arranged. For example, as illustrated in FIG. 4, ordinary imaging pixels may be arranged in between.

Figure 17:
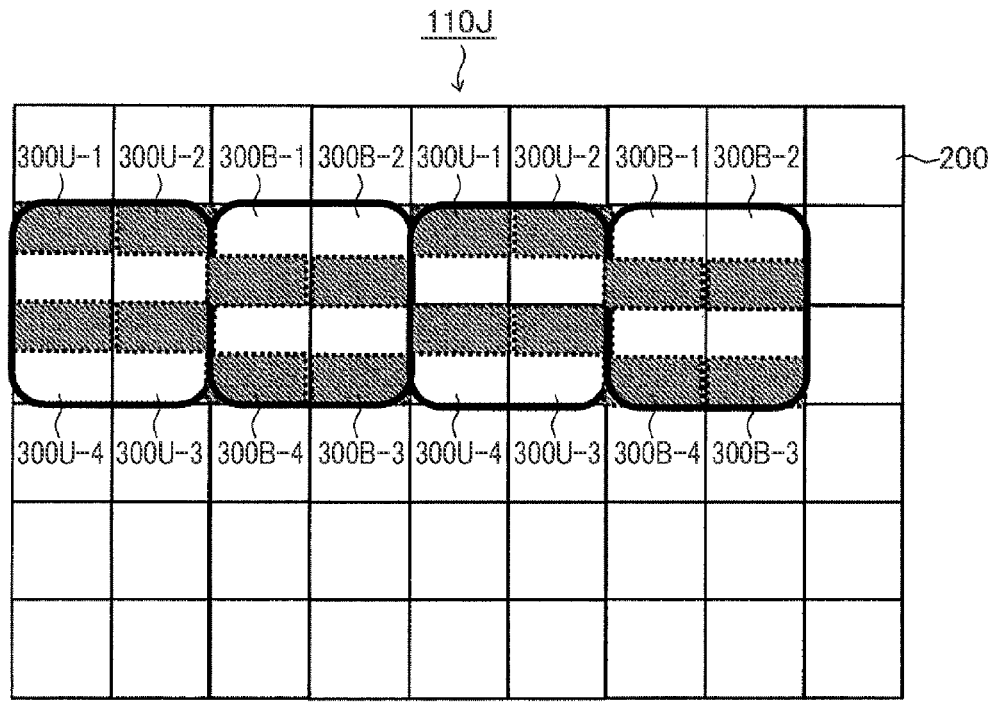
FIG. 17 is a diagram illustrating, for a 4-pixel-sharing case, a second example of a light shielding pattern of the focus detection pixels arranged in a pixel array portion as a fourth embodiment of the present technology.

FIG. 17 is a diagram illustrating, for a 4-pixel-sharing case, a second example of a light shielding pattern of the focus detection pixels arranged in a pixel array portion as a fourth embodiment of the present technology.

FIG. 17 illustrates an example in which upper and bottom light-shielded focus detection pixels 300 are arranged on a part of a pixel array portion 110J.

In this example, upper light-shielded, vertical 4-pixel-sharing focus detection pixels 300U-1, 300U-2, 300U-3, and 300U-4 and bottom light-shielded, vertical 4-pixel-sharing focus detection pixels 300B-1, 300B-2, 300B-3, and 300B-4 are arranged.

Further, although FIG. 17 is illustrated as if there are focus detection pixels consecutively arranged in the horizontal direction in the diagram, the focus detection pixels do not have to be consecutively arranged. For example, as illustrated in FIG. 4, ordinary imaging pixels may be arranged in between.

6. Fifth Embodiment

Next, a configuration example of focus detection pixels associated with a color filter will be described as a fifth embodiment.

Although in the following description an example is described using left and right light-shielded focus detection pixels, the present technology can be similarly applied to upper and bottom light shielding, slanted light shielding and the like.

Figure 18:
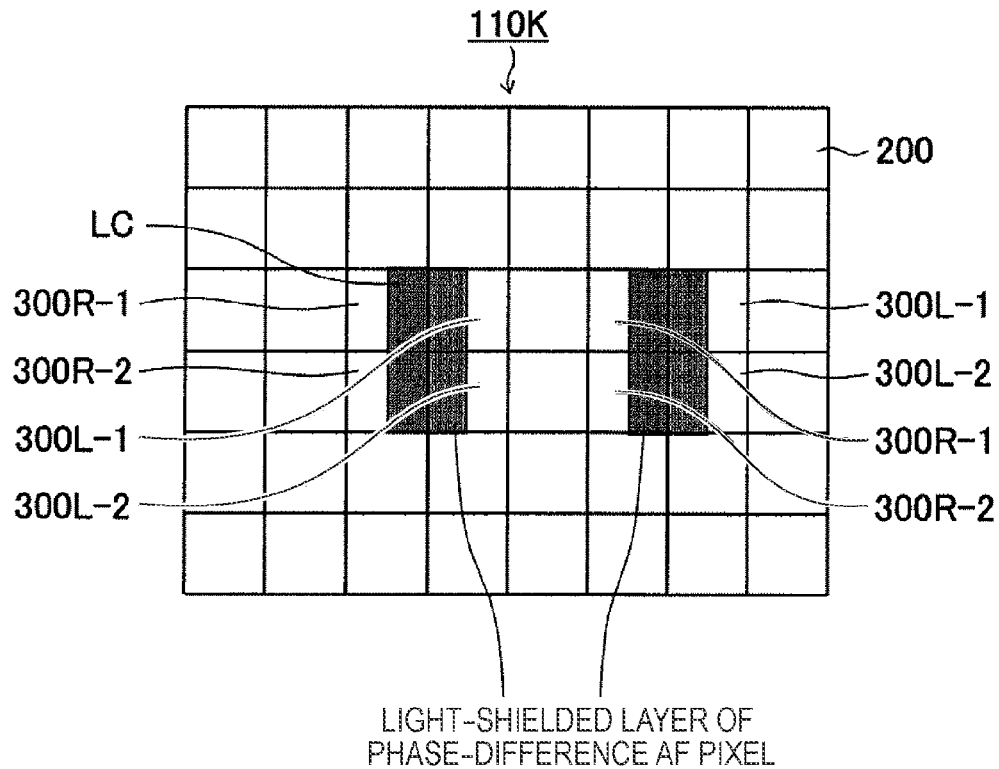
FIG. 18 is a diagram illustrating, for a 2-pixel-sharing case, an example of a pixel array pattern in which there is no color filter in the overall structure as a fifth embodiment of the present technology.

FIG. 18 is a diagram illustrating, for a 2-pixel-sharing case, an example of a pixel array pattern in which there is no color filter in the overall structure as a fifth embodiment of the present technology.

FIG. 18 illustrates an example in which upper and bottom light-shielded focus detection pixels 300 are arranged on a part of a pixel array portion 110K.

In this example, left light-shielded, vertical 2-pixel-sharing focus detection pixels 300L-1 and 300L-2 and right light-shielded, vertical 2-pixel-sharing focus detection pixels 300R-1 and 300R-2 are arranged.

Figure 19:
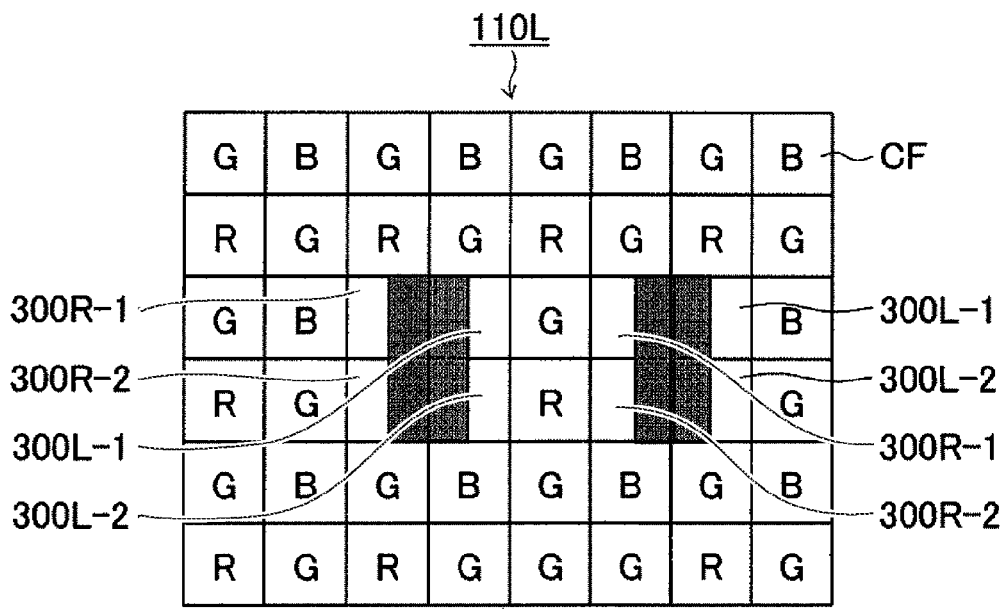
FIG. 19 is a diagram illustrating, for a 2-pixel-sharing case, an example of a pixel array pattern in which a color filter is provided in the overall structure, but not for the focus detection pixels, as a fifth embodiment of the present technology.

FIG. 19 is a diagram illustrating, for a 2-pixel-sharing case, an example of a pixel array pattern in which a color filter is provided in the overall structure, but not for the focus detection pixels, as a fifth embodiment of the present technology.

FIG. 19 illustrates an example in which, in an RGGB pixel Bayer array in which ordinary imaging pixels 200 are provided with a color filter CF, a pixel array portion 110L is configured so that focus detection pixels 300L-1, 300L-2, 300R-1, and 300R-2 are not provided with a color filter.

Figure 20:
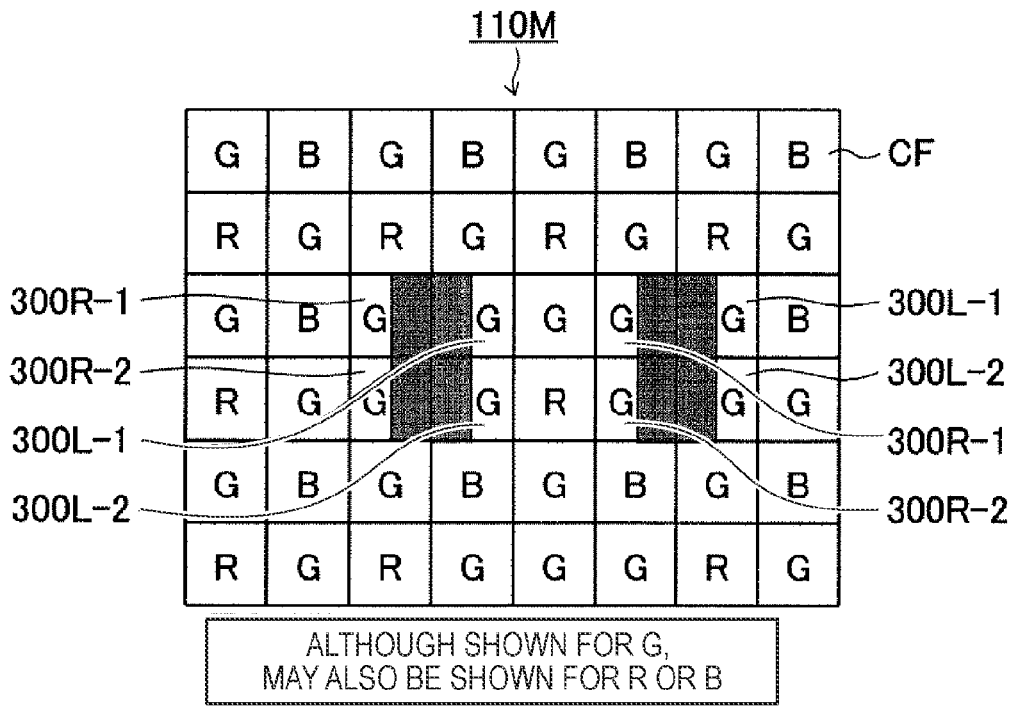
FIG. 20 is a diagram illustrating, for a 2-pixel-sharing case, an example of a pixel array pattern in which a color filter is provided in the overall structure, and is also arranged for the focus detection pixels, as a fifth embodiment of the present technology.

FIG. 20 is a diagram illustrating, for a 2-pixel-sharing case, an example of a pixel array pattern in which a color filter is provided in the overall structure, and is also provided for the focus detection pixels, as a fifth embodiment of the present technology.

FIG. 20 illustrates an example in which, in an RGGB pixel Bayer array in which ordinary imaging pixels 200 are provided with a color filter CF, a pixel array portion 110M is configured so that focus detection pixels 300L-1, 300L-2, 300R-1, and 300R-2 are provided with a G color filter.

Note that the color filter CF provided for the focus detection pixels may be a R or a B color filter instead of G.

Figure 21:
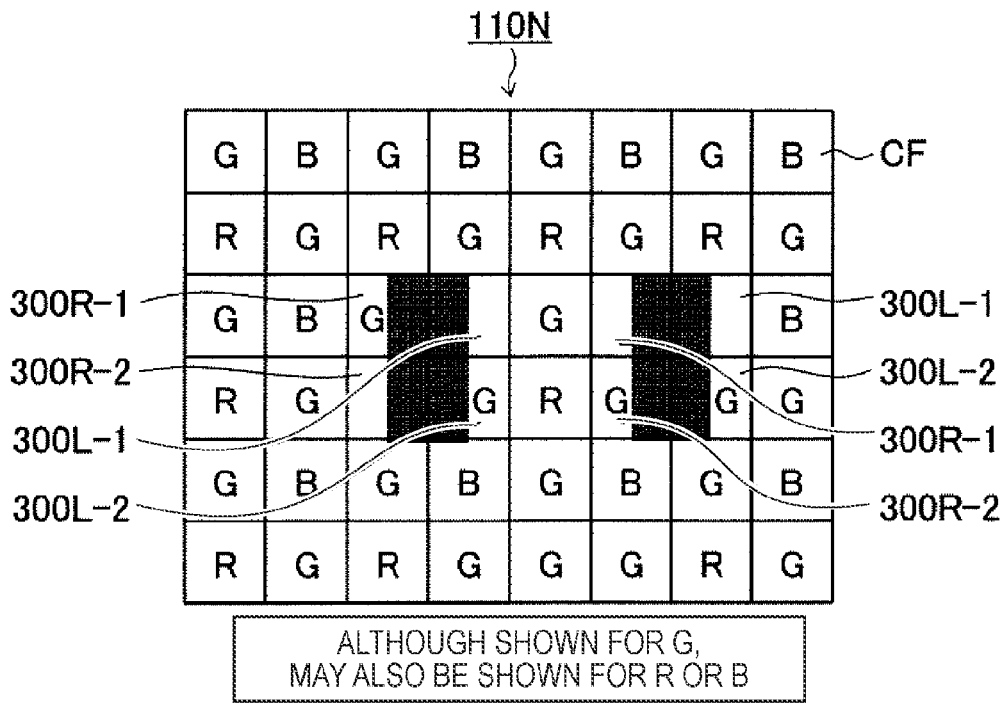
FIG. 21 is a diagram illustrating, for a 2-pixel-sharing case, an example of a pixel array pattern in which a color filter is provided in the overall structure, and is also arranged for a part of the focus detection pixels, as a fifth embodiment of the present technology.

FIG. 21 is a diagram illustrating, for a 2-pixel-sharing case, an example of a pixel array pattern in which a color filter is provided in the overall structure, and is also provided for a part of the focus detection pixels, as a fifth embodiment of the present technology.

FIG. 21 illustrates an example in which, in an RGGB pixel Bayer array in which ordinary imaging pixels 200 are provided with a color filter CF, a pixel array portion 110N is configured so that focus detection pixels 300L-1, 300L-2, 300R-1, and 300R-2 are partly provided with a G color filter. In this example, a color filter is provided for one of the shared pixels.

Note that the color filter CF provided for the focus detection pixels may be a R or a B color filter instead of G.

7. Sixth Embodiment

Next, a pixel arrangement example of horizontal 2-pixel-sharing will be described as a sixth embodiment.

Although in the above first and third embodiments an example was described of a vertical 2-pixel-sharing type pixel array, in the sixth embodiment, an example of a horizontal 2-pixel-sharing type will be described.

Figure 22:
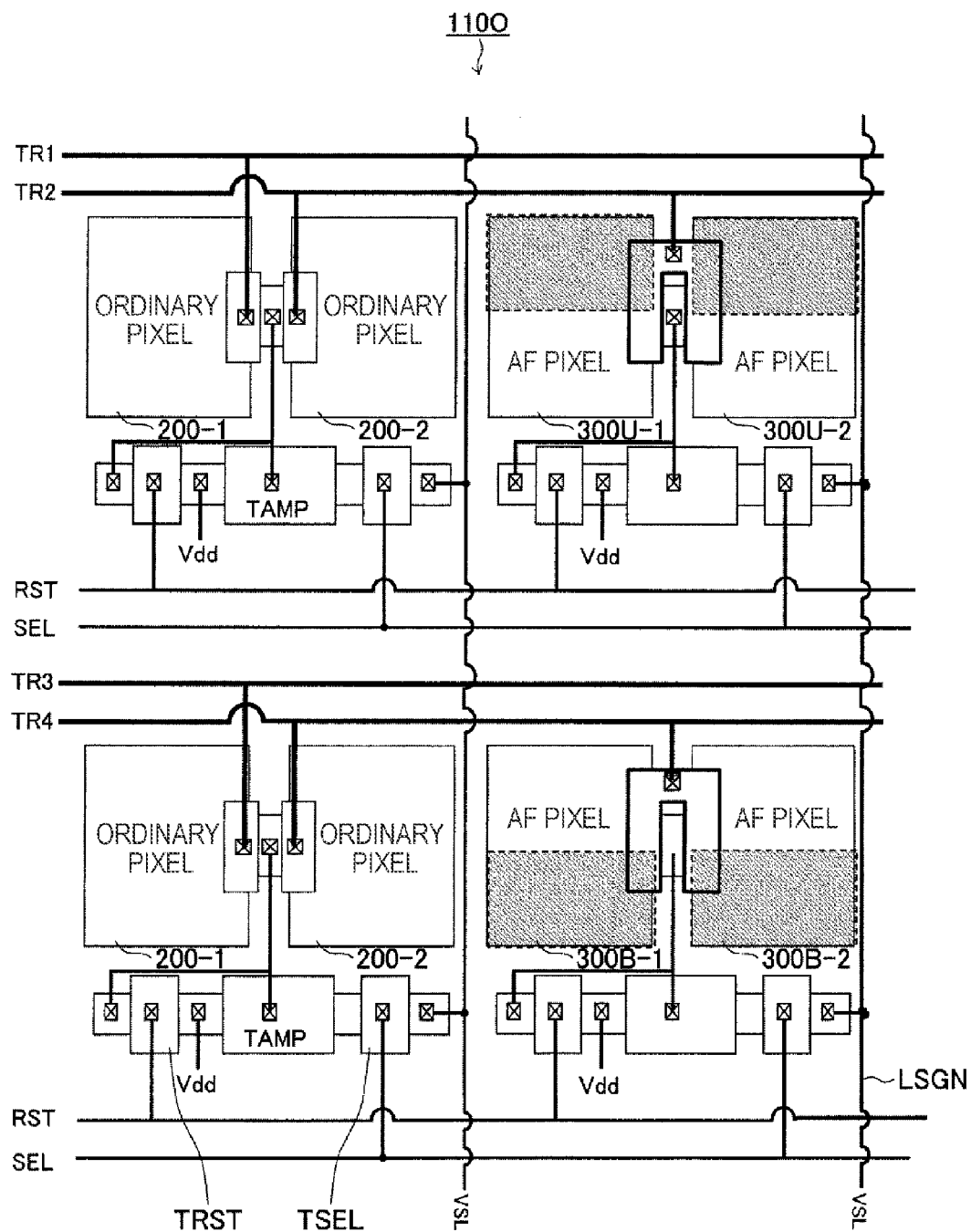
FIG. 22 is a diagram illustrating a first example of a horizontal 2-pixel-sharing pixel array as a sixth embodiment of the present technology.

FIG. 22 is a diagram illustrating a first example of a horizontal 2-pixel-sharing pixel array as a sixth embodiment of the present technology.

Since the basic circuit configuration and the like are the same as for vertical pixel 2-pixel-sharing, a description thereof will be omitted here.

The pixel array portion 110O illustrated in FIG. 22 is a 2×2 array, in which upper light shielding focus detection pixels 300U-1 and 300U-2 are arranged in a first row, second column, and bottom light shielding focus detection pixels 300B-1 and 300B-2 are arranged in a second row, second column.

Further, the transfer gate electrode of the focus detection pixels 300U-1 and 300U-2 are commonly connected to the transfer control line LTR2, and the transfer gate electrode of the focus detection pixels 300B-1 and 300B-2 are commonly connected to the transfer control line LTR4.

In the following examples too, the transfer gate electrodes of the focus detection pixels are connected to the transfer control lines LTR2 and LTR4.

Figure 23:
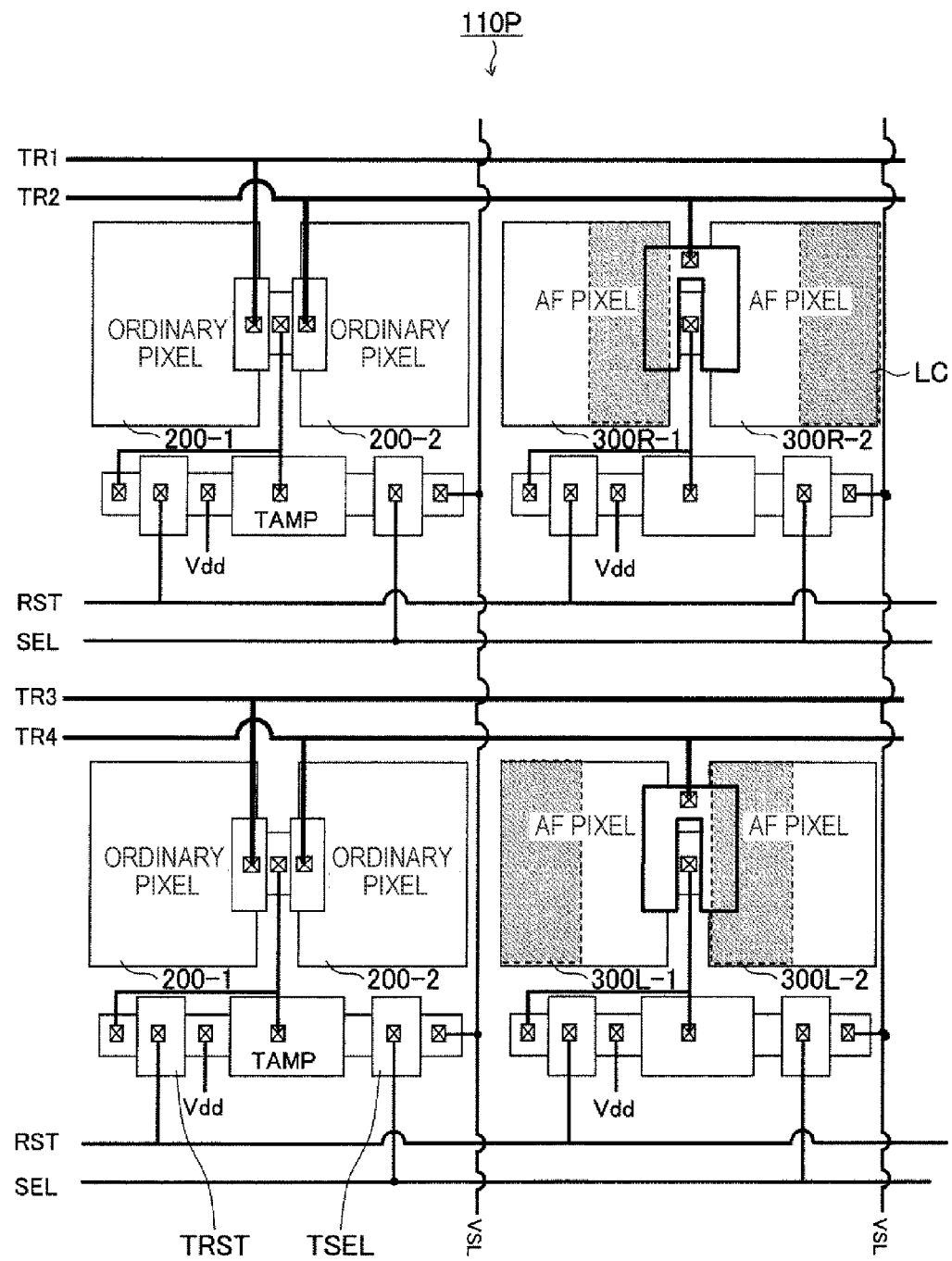
FIG. 23 is a diagram illustrating a second example of a horizontal 2-pixel-sharing pixel array as a sixth embodiment of the present technology.

FIG. 23 is a diagram illustrating a second example of a horizontal 2-pixel-sharing pixel array as a sixth embodiment of the present technology.

The pixel array portion 110P illustrated in FIG. 23 is a 2×2 array, in which right light shielding focus detection pixels 300R-1 and 300R-2 are arranged in a first row, second column, and left light shielding focus detection pixels 300L-1 and 300L-2 are arranged in a second row, second column.

Further, the transfer gate electrode of the focus detection pixels 300R-1 and 300R-2 are commonly connected to the transfer control line LTR2, and the transfer gate electrode of the focus detection pixels 300L-1 and 300L-2 are commonly connected to the transfer control line LTR4.

In the following examples too, the transfer gate electrodes of the focus detection pixels are connected to the transfer control lines LTR2 and LTR4.

Figure 24:
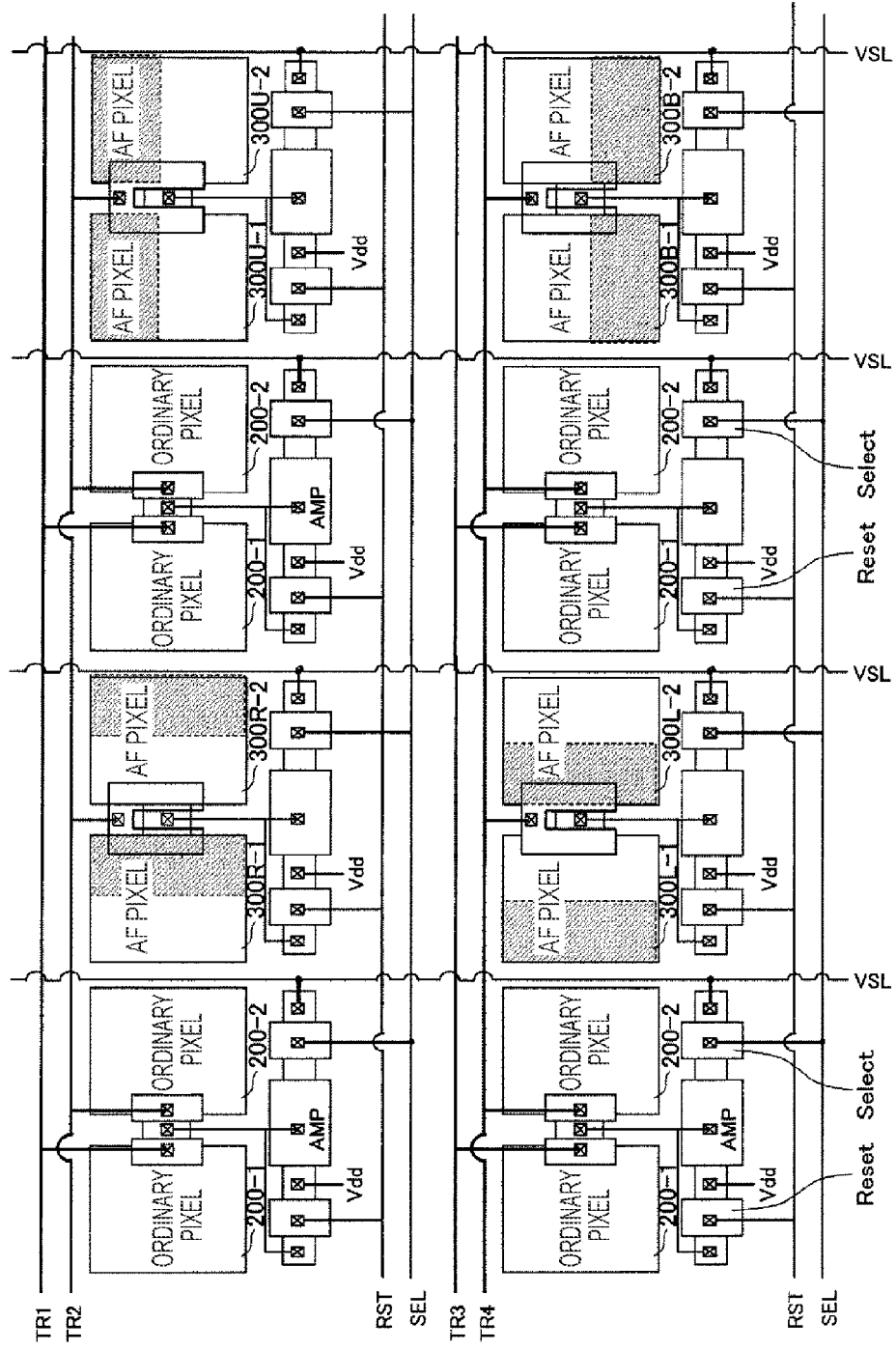
FIG. 24 is a diagram illustrating a third example of a horizontal 2-pixel-sharing pixel array as a sixth embodiment of the present technology.

FIG. 24 is a diagram illustrating a third example of a horizontal 2-pixel-sharing pixel array as a sixth embodiment of the present technology.

The pixel array portion 110Q illustrated in FIG. 24 is a 2×2 array, in which right light shielding focus detection pixels 300R-1 and 300R-2 are arranged in a first row, second column, and left light shielding focus detection pixels 300L-1 and 300L-2 are arranged in a second row, second column.

Upper light shielding focus detection pixels 300U-1 and 300U-2 are arranged in a first row, fourth column, and bottom light shielding focus detection pixels 300B-1 and 300B-2 are arranged in a second row, fourth column.

Further, the transfer gate electrode of the focus detection pixels 300R-1, 300R-2, 300U-1, and 300U-2 are commonly connected to the transfer control line LTR2.

The transfer gate electrode of the focus detection pixels 300L-1, 300L-2, 300B-1, and 300B-2 are commonly connected to the transfer control line LTR4.

Thus, in the example illustrated in FIG. 24, an array pattern is employed in which left and right light-shielded and upper and bottom light-shielded focus detection pixels are arranged in an intermingled manner.

When looked at in a lateral (horizontal) direction, two focus detection AF pixels are arranged alternating with (skipping two pixels) two ordinary pixels. However, ordinary pixels may be may be arranged in between focus detection pixels, or focus detection pixels may be consecutively arranged.

Similarly, when looked at in a perpendicular (vertical) direction, although the focus detection pixels are arranged consecutively, a consecutive arrangement is not necessary. For example, ordinary imaging pixels may be arranged between focus detection pixels.

Figure 25:
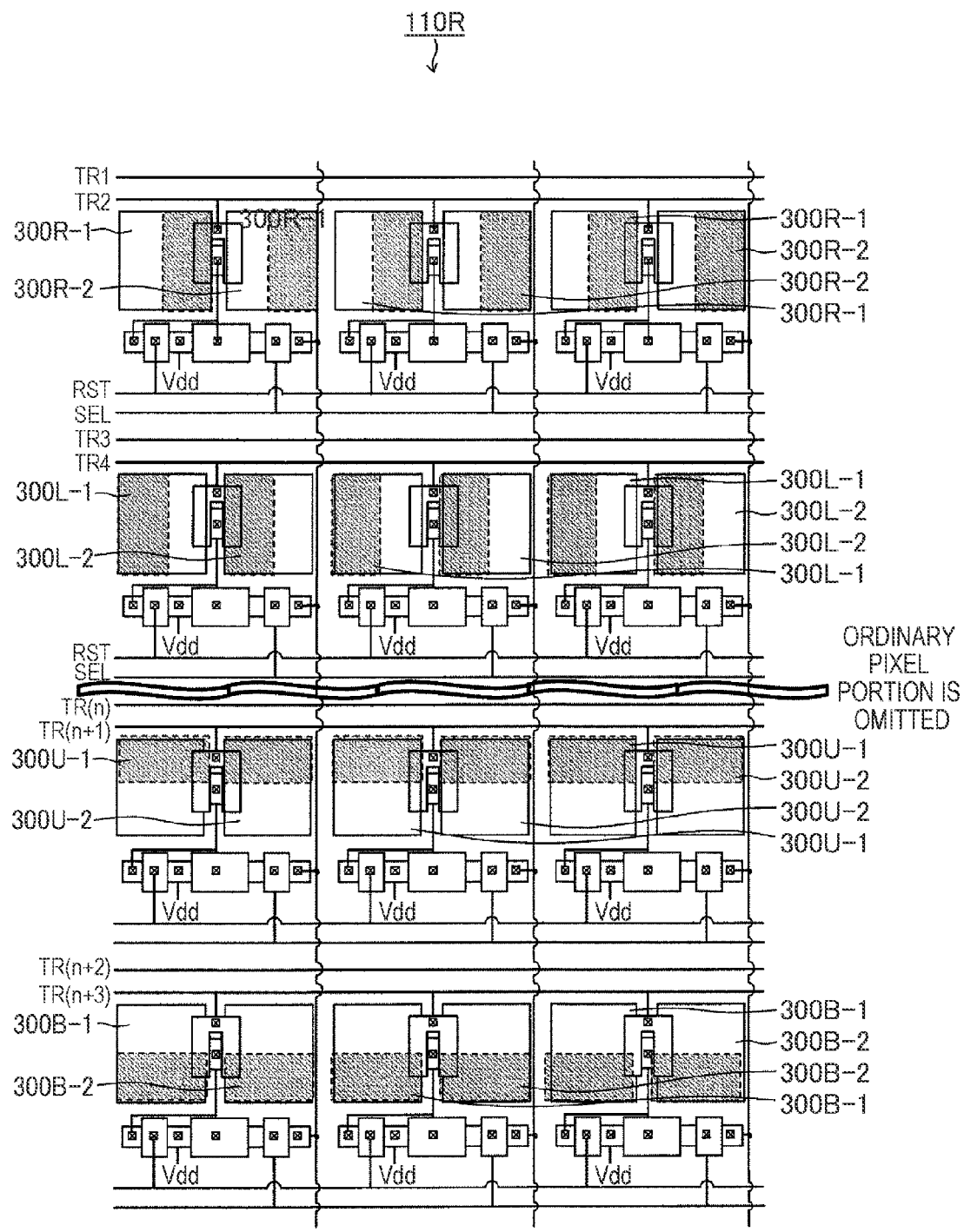
FIG. 25 is a diagram illustrating a fourth example of a horizontal 2-pixel-sharing pixel array as a sixth embodiment of the present technology.

FIG. 25 is a diagram illustrating a fourth example of a horizontal 2-pixel-sharing pixel array as a sixth embodiment of the present technology.

The pixel array portion 110R illustrated in FIG. 25 employs an array pattern in which left and right light-shielded and upper and bottom light-shielded focus detection pixels are arranged consecutively.

A detailed description of this array pattern will be omitted.

FIGS. 26(A) to 26(D) are diagrams illustrating, for a horizontal 2-pixel-sharing case, an example of a light shielding pattern of the focus detection pixels arranged in a pixel array portion as a sixth embodiment of the present technology.

Figure 26:
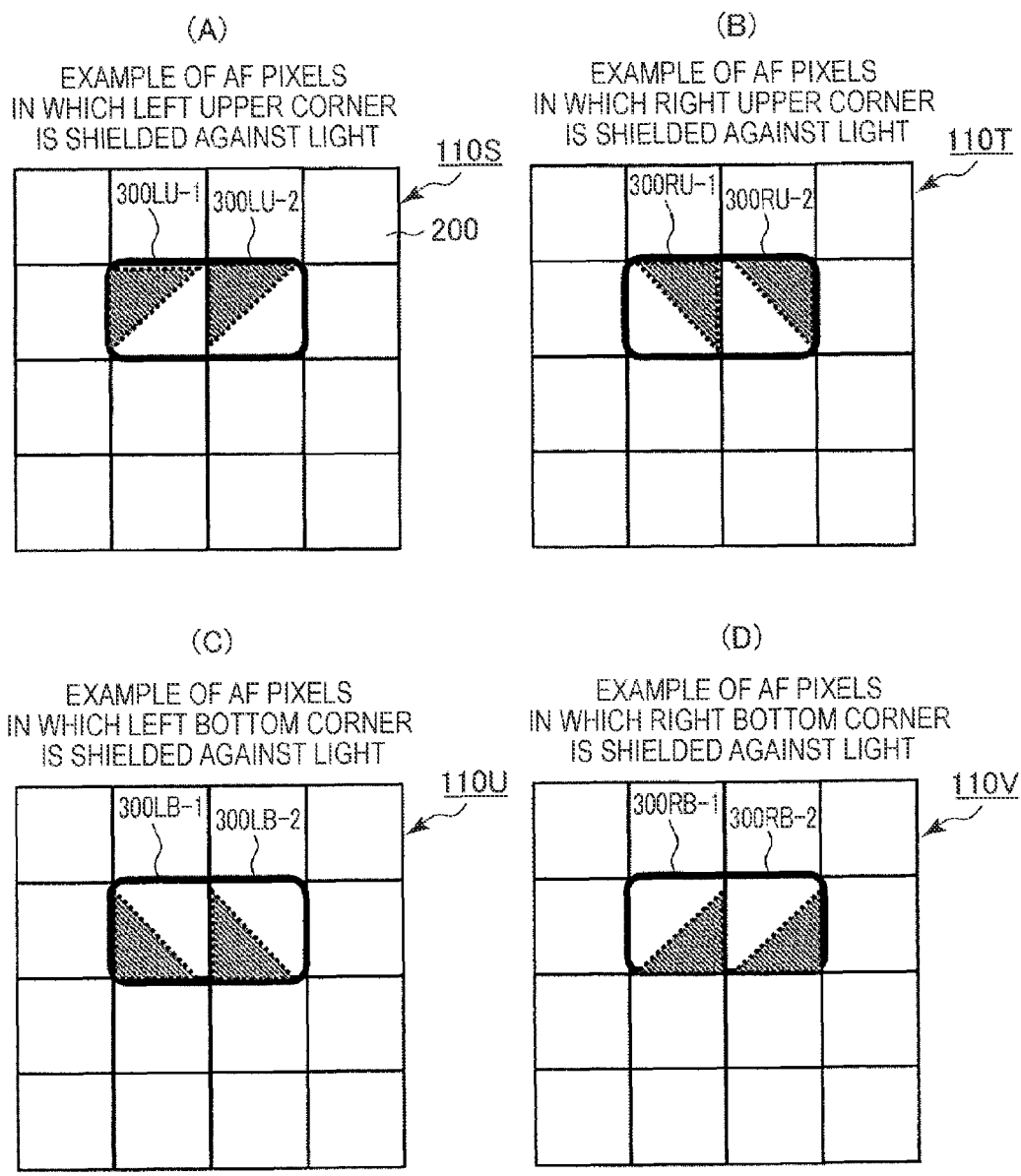
FIG. 26 is series of diagrams illustrating, for a horizontal 2-pixel-sharing case, an example of a light shielding pattern of the focus detection pixels arranged in a pixel array portion as a sixth embodiment of the present technology.

FIG. 26 illustrates an example of slanted light shielding.

FIG. 26(A) illustrates focus detection pixels 300LU-1 and 300LU-2 in which a left upper corner is shielded.

FIG. 26(B) illustrates focus detection pixels 300RU-1 and 300RU-2 in which a right upper corner is shielded.

FIG. 26(C) illustrates focus detection pixels 300LB-1 and 300LB-2 in which a left bottom corner is shielded.

FIG. 26(D) illustrates focus detection pixels 300RB-1 and 300RB-2 in which a right bottom corner is shielded.

As described above, according to an embodiment of the present technology, the following advantageous effects can be obtained.

According to an embodiment of the present technology, since accumulated signals from the focus detection pixels sharing a floating diffusion layer FD are subjected to FD addition, the signal level (sensitivity) of the focus detection pixels improves, so that focus detection accuracy during low illumination is improved.

The PD characteristics (Qs etc.) of the focus detection pixels can be the same as those of the ordinary imaging pixels.

Further, miniaturization of the photoelectric conversion unit (PD) is better than in the related-art examples, the ordinary imaging pixels and the focus detection pixels can be configured with the same potential design, and lower costs can be achieved.

In addition, according to an embodiment of the present technology, since signals can be added by the FD layer due to electrical sharing of the transfer gates in the pixel array portion, twice as many signals than previously can be obtained, so that the sensitivity (phase difference accuracy) of the focus detection pixels improves.

Therefore, the need to incorporate a special potential for the focus detection pixels is eliminated, so that the incorporation of a potential for the focus detection pixels can be carried out in the same manner as for the ordinary imaging pixels.

A solid-state image sensor having such advantageous effects can be applied as an imaging device in a digital camera or a video camera.

8. Configuration Example of a Camera System

Figure 27:
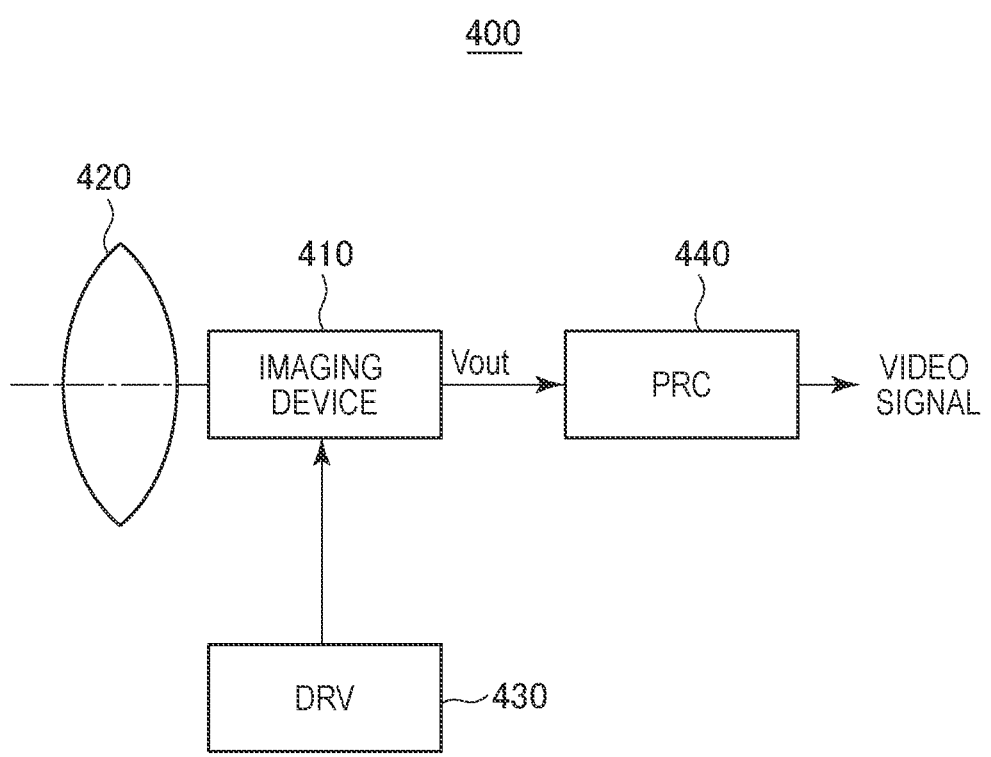
FIG. 27 is a diagram illustrating an example of a configuration of a camera system in which the solid-state image sensor according to an embodiment of the present technology is applied.

FIG. 27 is a diagram illustrating an example of a configuration of a camera system in which the solid-state image sensor according to an embodiment of the present technology is applied.

As illustrated in FIG. 27, a camera system 400 has an imaging device 410 that can apply the solid-state image sensor 100 according to an embodiment of the present technology.

Further, the camera system 400 has an optical system that guides light incident on a pixel area of the imaging device 410 (forms an image of an object image), for example a lens 420 that forms an image on an imaging plane from incident light (image light).

The camera system 400 has a drive circuit (DRV) 430 for driving the imaging device 410 and a signal processing circuit (PRC) 440 for processing output signals from the imaging device 410.

The drive circuit 430 has a timing generator (not illustrated) that generates various timing signals including a start pulse and a clock pulse for driving the circuits in the imaging device 410. The drive circuit 430 drives the imaging device 410 based on a predetermined timing signal.

Further, the signal processing circuit 440 performs predetermined signal processing on the output signals from the imaging device 410.

For example, by carrying out image deviation detection and calculation processing (correlation calculation processing, phase difference detection processing) with the signal processing circuit 440, the amount of image deviation between a pair of images is detected based on a so-called pupil division phase difference detection method.

Further, the deviation (defocus amount) of the current image forming plane (the image forming plane at the focus detection position corresponding to the position of the microlens array on the expected image forming plane) with respect to the expected image forming plane is calculated by performing conversion and calculation based on a centroid interval of a pair of focus pupils on the image deviation amount.

The image signals processed by the signal processing circuit 440 are recorded on a recording medium such as a memory. The image information recorded on the recording medium is produced as a hard copy by printing, for example. Further, the image signals processed by the signal processing circuit 440 are displayed as moving images on a monitor configured from a liquid crystal display, for example.

As described above, a low power consumption, high accuracy camera can be realized by mounting the above-described solid-state image sensor 100 as an imaging device 410 in an imaging apparatus, such as a digital camera.

Additionally, the present technology may also be configured as below.

(1) A solid-state image sensor including:
a pixel array portion formed from a two-dimensional array of ordinary imaging pixels each having a photoelectric conversion unit and configured to output an electric signal obtained through photoelectric conversion as a pixel signal, and focus detection pixels for detecting focus,
wherein the focus detection pixels include at least a first focus detection pixel and a second focus detection pixel each having a photoelectric conversion unit and configured to transfer and output an electric signal obtained through photoelectric conversion to an output node,
wherein the first focus detection pixel and the second focus detection pixel share the output node,
wherein the first focus detection pixel includes
a first photoelectric conversion unit, and
a first transfer gate for reading out an electron generated through photoelectric conversion in the first photoelectric conversion unit to the shared output node,
wherein the second focus detection pixel includes
a second photoelectric conversion unit, and
a second transfer gate for reading out an electron generated through photoelectric conversion in the second photoelectric conversion unit to the shared output node, and
wherein the first transfer gate of the first focus detection pixel and the second transfer gate of the second focus detection pixel are electrically shared by a gate electrode to which a control signal for conduction control is applied.

(2) The solid-state image sensor according to (1),
wherein the ordinary imaging pixels share, with at least two pixels, an output node to which an electron generated through photoelectric conversion is transferred,
wherein the ordinary imaging pixels each have transfer gates such that the two pixels transfer to the shared output node,
wherein each of the transfer gates is subjected to conduction control by an individual transfer control signal, and
wherein the first transfer gate of the first focus detection pixel and the second transfer gate of the second focus detection pixel are subjected to conduction control concurrently and in parallel by the transfer control signal.

(3) The solid-state image sensor according to (1) or (2), wherein at least one edge of the focus detection pixel for detecting focus and at least one edge of the ordinary imaging pixel are adjacent.

(4) The solid-state image sensor according to any one of (1) to (3), wherein the first focus detection pixel and the second focus detection pixel have parts of light incident areas shielded at which light is incident on the photoelectric conversion units.

(5) The solid-state image sensor according to any one of (1) to (4), wherein the first focus detection pixel and the second focus detection pixel have a same aperture size.

(6) The solid-state image sensor according to any one of (1) to (5), wherein the ordinary imaging pixels have a larger aperture size than an aperture size of the focus detection pixels.

(7) The solid-state image sensor according to any one of (1) to (6), wherein the focus detection pixels include a pixel for which a color filter is not provided.

(8) The solid-state image sensor according to any one of (1) to (6),
wherein the pixel array portion is provided with a color filter, and
wherein a color filter is not provided for one of the first focus detection pixel or the second focus detection pixel.

(9) The solid-state image sensor according to any one of (1) to (6),
wherein the pixel array portion is provided with a color filter, and
wherein color filters having a same color are provided for the first focus detection pixel and the second focus detection pixel.

(10) The solid-state image sensor according to any one of (1) to (9), wherein the focus detection pixels for detecting focus and the ordinary imaging pixels have a same pixel size.

(11) The solid-state image sensor according to any one of (1) to (10), wherein the focus detection pixels sharing the output node include two or more pixels.

(12) A camera system including:
a solid-state image sensor;
an optical unit configured to form an image of an object image on the solid-state image sensor; and
a signal processing unit configured to process an output signal from the solid-state image sensor,
the solid-state image sensor including a pixel array portion formed from a two-dimensional array of ordinary imaging pixels each having a photoelectric conversion unit and configured to output an electric signal obtained through photoelectric conversion as a pixel signal, and focus detection pixels for detecting focus,
wherein the focus detection pixels include at least a first focus detection pixel and a second focus detection pixel each having a photoelectric conversion unit and configured to transfer and output an electric signal obtained through photoelectric conversion to an output node,
wherein the first focus detection pixel and the second focus detection pixel share the output node,
wherein the first focus detection pixel includes
a first photoelectric conversion unit, and
a first transfer gate for reading out an electron generated through photoelectric conversion in the first photoelectric conversion unit to the shared output node,
wherein the second focus detection pixel includes
a second photoelectric conversion unit, and
a second transfer gate for reading out an electron generated through photoelectric conversion in the second photoelectric conversion unit to the shared output node, and
wherein the first transfer gate of the first focus detection pixel and the second transfer gate of the second focus detection pixel are electrically shared by a gate electrode to which a control signal for conduction control is applied.

It should be understood by those skilled in the art that various modifications, combinations, sub-combinations and alterations may occur depending on design requirements and other factors insofar as they are within the scope of the appended claims or the equivalents thereof.

The present disclosure contains subject matter related to that disclosed in Japanese Priority Patent Application JP 2012-018383 filed in the Japan Patent Office on Jan. 31, 2012, the entire content of which is hereby incorporated by reference.

What is claimed is:

1. An image sensor comprising:
a plurality of focus detection pixels for detecting focus, wherein the focus detection pixels include at least a first focus detection pixel and a second focus detection pixel each having a photoelectric conversion unit, wherein an output node of the first focus detection pixel is connected to an output node of the second focus detection pixel; and
a plurality of imaging pixels each having a photoelectric conversion unit,
wherein,
the first focus detection pixel includes (a) a first photoelectric conversion unit, and (b) a first transfer transistor connected between the first photoelectric conversion unit and the output node of the first focus detection pixel,
the second focus detection pixel includes (a) a second photoelectric conversion unit, and (b) a second transfer transistor connected between the second photoelectric conversion unit and the output node of the second focus detection pixel,
a gate of the first transfer transistor and a gate of the second transfer transistor are electrically connected through a connection electrode,
the imaging pixels share, with at least two pixels, an output node to which an electron generated through photoelectric conversion is transferred,
the imaging pixels each have transfer gates such that the two pixels transfer to the shared output node,
each of the transfer gates is subjected to conduction control by an individual transfer control signal, and
the first transfer gate of the first focus detection pixel and the second transfer gate of the second focus detection pixel are subjected to conduction control concurrently and in parallel by the transfer control signal.

2. The image sensor according to claim 1, wherein the first focus detection pixel and the second focus detection pixel have parts of light incident areas shielded at which light is incident on the photoelectric conversion units.

3. The image sensor according to claim 1, wherein the connection electrode has an "[" shape in planar view.

4. The image sensor according to claim 1, wherein the imaging pixels have a larger aperture size than an aperture size of the focus detection pixels.

5. The image sensor according to claim 1, wherein the focus detection pixels include a pixel for which a color filter is not provided.

6. The image sensor according to claim 1, wherein:
a color filter is provided for the plurality of the image pixels, and
a color filter is not provided for one of the first focus detection pixel or the second focus detection pixel.

7. The image sensor according to claim 1, wherein:
a color filter is provided for the plurality of the image pixels, and
color filters having a same color are provided for the first focus detection pixel and the second focus detection pixel.

8. A camera system comprising the image sensor according to claim 1.

9. An image sensor comprising:
a plurality of focus detection pixels for detecting focus, wherein the focus detection pixels include at least a first focus detection pixel and a second focus detection pixel; and
a plurality of imaging pixels each having a photoelectric conversion unit,
wherein,
the first focus detection pixel includes (a) a first photoelectric conversion unit, and (b) a first transfer transistor connected between the first photoelectric conversion unit and an output node,
the second focus detection pixel includes (a) a second photoelectric conversion unit, and (b) a second transfer transistor connected between the second photoelectric conversion unit and the output node,
a gate of the first transfer transistor and a gate of the second transfer transistor are electrically connected through a connection electrode,
the imaging pixels share, with at least two pixels, an output node to which an electron generated through photoelectric conversion is transferred,
the imaging pixels each have transfer gates such that the two pixels transfer to the shared output node, each of the transfer gates is subjected to conduction control by an individual transfer control signal, and the first transfer gate of the first focus detection pixel and the second transfer gate of the second focus detection pixel are subjected to conduction control concurrently and in parallel by the transfer control signal.

10. The image sensor according to claim 9, wherein the first focus detection pixel and the second focus detection pixel have parts of light incident areas shielded at which light is incident on the photoelectric conversion units.

11. The image sensor according to claim 9, wherein the connection electrode has an "[" shape in planar view.

12. The image sensor according to claim 9, wherein the imaging pixels have a larger aperture size than an aperture size of the focus detection pixels.

13. The image sensor according to claim 9, wherein the focus detection pixels include a pixel for which a color filter is not provided.

14. The image sensor according to claim 9, wherein:
 a color filter is provided for the plurality of the image pixels, and
 a color filter is not provided for one of the first focus detection pixel or the second focus detection pixel.

15. The image sensor according to claim 9, wherein:
 a color filter is provided for the plurality of the image pixels, and
 color filters having a same color are provided for the first focus detection pixel and the second focus detection pixel.

16. A camera system comprising the image sensor according to claim 9.

* * * * *